(12) United States Patent
Brandl et al.

(10) Patent No.: US 10,847,686 B2
(45) Date of Patent: Nov. 24, 2020

(54) PRODUCTION OF OPTOELECTRONIC COMPONENTS

(71) Applicant: OSRAM OLED GmbH, Regensburg (DE)

(72) Inventors: Martin Brandl, Kelheim (DE); Tobias Gebuhr, Regensburg (DE); Thomas Schwarz, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/122,680

(22) PCT Filed: Mar. 3, 2015

(86) PCT No.: PCT/EP2015/054371
§ 371 (c)(1),
(2) Date: Aug. 31, 2016

(87) PCT Pub. No.: WO2015/013223
PCT Pub. Date: Sep. 11, 2015

(65) Prior Publication Data
US 2017/0077361 A1 Mar. 16, 2017

(30) Foreign Application Priority Data
Mar. 4, 2014 (DE) .................. 10 2014 102 810

(51) Int. Cl.
*H01L 33/50* (2010.01)
*H01L 33/62* (2010.01)
(Continued)

(52) U.S. Cl.
CPC ............ *H01L 33/507* (2013.01); *H01L 24/97* (2013.01); *H01L 33/0095* (2013.01);
(Continued)

(58) Field of Classification Search
None
See application file for complete search history.

(56) References Cited

U.S. PATENT DOCUMENTS 8,044,420 B2 * 10/2011 Lee .................... H01L 33/483
257/100
9,076,781 B2 7/2015 Zeiler et al.
(Continued)

FOREIGN PATENT DOCUMENTS

CN 101971353 A1 2/2011
CN 101997074 3/2011
(Continued)

OTHER PUBLICATIONS

First Office Action dated Nov. 30, 2017, of corresponding Chinese Application No. 201580011506.5, along with an English translation.
(Continued)

*Primary Examiner* — Abul Kalam
(74) *Attorney, Agent, or Firm* — DLA Piper LLP (US)

(57) ABSTRACT

A method of producing optoelectronic components includes providing a carrier; arranging optoelectronic semiconductor chips on the carrier; forming a conversion layer for radiation conversion on the carrier, wherein the optoelectronic semiconductor chips are surrounded by the conversion layer; and carrying out a singulation process to form separate optoelectronic components, wherein at least the conversion layer is severed.

11 Claims, 12 Drawing Sheets

(51) Int. Cl.
*H01L 23/00* (2006.01)
*H01L 33/00* (2010.01)
*H01L 33/56* (2010.01)
*H01L 33/60* (2010.01)
*H01L 33/48* (2010.01)

(52) U.S. Cl.
CPC .............. *H01L 33/56* (2013.01); *H01L 33/60* (2013.01); *H01L 33/62* (2013.01); *H01L 33/486* (2013.01); *H01L 33/50* (2013.01); *H01L 2224/48091* (2013.01); *H01L 2224/48247* (2013.01); *H01L 2224/48257* (2013.01); *H01L 2224/48471* (2013.01); *H01L 2224/48479* (2013.01); *H01L 2924/00014* (2013.01); *H01L 2924/181* (2013.01); *H01L 2933/005* (2013.01); *H01L 2933/0033* (2013.01); *H01L 2933/0041* (2013.01); *H01L 2933/0066* (2013.01)

(56) References Cited

U.S. PATENT DOCUMENTS

| | | | |
|---|---|---|---|
| 9,698,282 | B2 | 7/2017 | Jaeger et al. |
| 2004/0069993 | A1* | 4/2004 | Murano .................. H01L 24/97 257/79 |
| 2005/0045903 | A1 | 3/2005 | Abe et al. |
| 2008/0036362 | A1 | 2/2008 | Tanimoto et al. |
| 2009/0218588 | A1 | 9/2009 | Panaccione et al. |
| 2010/0176407 | A1* | 7/2010 | Lee ....................... H01L 33/483 257/98 |
| 2011/0133232 | A1* | 6/2011 | Yoshioka .............. H01L 24/97 257/98 |
| 2011/0198646 | A1 | 8/2011 | Wu et al. |
| 2012/0025241 | A1 | 2/2012 | Xiao et al. |
| 2012/0061703 | A1* | 3/2012 | Kobayashi ............. H01L 33/54 257/98 |
| 2012/0161180 | A1 | 6/2012 | Komatsu et al. |
| 2013/0221509 | A1 | 8/2013 | Oda et al. |
| 2013/0256733 | A1 | 10/2013 | Lin et al. |

FOREIGN PATENT DOCUMENTS

| | | |
|---|---|---|
| CN | 102163659 | 8/2011 |
| CN | 103003965 | 3/2013 |
| CN | 103190008 A | 7/2013 |
| DE | 10 2010 027 313 A1 | 1/2012 |
| JP | 2001-274463 | 10/2001 |
| JP | 2008-120850 | 5/2008 |
| JP | 2008-521210 | 6/2008 |
| JP | 2010-135718 | 6/2010 |
| JP | 2011-077048 | 4/2011 |
| JP | 2011-091204 | 5/2011 |
| JP | 2011-176256 | 9/2011 |
| JP | 2012-142426 | 7/2012 |
| JP | 2012-191233 | 10/2012 |
| JP | 2012-253234 | 12/2012 |
| JP | 2013-140892 | 7/2013 |
| JP | 2013-161870 | 8/2013 |
| WO | 2007/025515 A1 | 3/2007 |
| WO | 2009/075753 A2 | 6/2009 |
| WO | 2009/143789 A1 | 12/2009 |

OTHER PUBLICATIONS

English translation of the Notice of Reasons for Rejection dated Oct. 3, 2017, of corresponding Japanese Patent Application No. 2016-555599.

Third Office Action dated Jan. 25, 2019, of corresponding Chinese Application No. 201580011506.5, along with an English translation.

* cited by examiner

PRODUCTION OF OPTOELECTRONIC COMPONENTS

TECHNICAL FIELD

This disclosure relates to a method of producing optoelectronic components and an optoelectronic component.

BACKGROUND

Optoelectronic components that generate light radiation may be realized in the form of QFN packages (Quad Flat No Leads). The current production of such components may be associated with disadvantages.

A metallic leadframe is usually provided, which is encapsulated with a molding compound to form a molded body or housing body in a transfer molding process. The leadframe comprises planar terminal elements and connection elements via which the terminal elements are connected. The molded body is formed with cavities. As a result, the terminal elements of the leadframe are exposed at a front side. Afterward, at those locations, radiation-emitting optoelectronic semiconductor chips are arranged on the terminal elements and wired. The rear sides of the terminal elements likewise remain free such that the QFN components produced are suitable for surface mounting. Further processes fill the cavities with a potting compound, and singulate the component assemblage produced in this way into individual components. The potting compound may be configured to convert light radiation of the semiconductor chips.

Forming the molded body with cavities for the semiconductor chips has the effect that the components fabricated by the method have large lateral dimensions. In the same way, the component assemblage may be realized only with a small packing density. This results in high production and hence component costs.

Different shapes of terminal elements and different chip arrangements may be realized by different configurations of the leadframe. This presupposes in each case a corresponding position of the cavities of the molded body. Different configurations of the leadframe therefore require the use of different transfer molding tools to form the molded body, which is associated with high costs.

After the leadframe has been encapsulated by molding, the terminal elements at the front side may comprise residues of the molding compound. So that this does not lead to problems when arranging the semiconductor chips, a cleaning step is usually carried out to remove the residues (deflashing). Gaps between the leadframe and the molded body may be formed in this process. The subsequent encapsulation of the cavities may have the consequence that potting material used in the process creeps through the gaps and contaminates the rear sides of the terminal elements. Therefore, a further cleaning step is required to remove the rear-side contaminants.

Singulation involves severing the molded body and the connection structures of the metallic leadframe, that is to say severing an inhomogeneous material combination. This procedure is carried out with the aid of a time- and cost-intensive sawing process in which a foilshaped saw blade is employed. The high costs stem, inter alia, from the saw foil used and saw blade wear.

There is thus a need to provide improved production of optoelectronic components.

SUMMARY

We provide a method of producing optoelectronic components, including providing a carrier; arranging optoelectronic semiconductor chips on the carrier; forming a conversion layer for radiation conversion on the carrier, wherein the optoelectronic semiconductor chips are surrounded by the conversion layer; and carrying out a singulation process to form separate optoelectronic components, wherein at least the conversion layer is severed.

We also provide an optoelectronic component, produced by carrying out the method of producing optoelectronic components, including providing a carrier; arranging optoelectronic semiconductor chips on the carrier; forming a conversion layer for radiation conversion on the carrier, wherein the optoelectronic semiconductor chips are surrounded by the conversion layer; and carrying out a singulation process to form separate optoelectronic components, wherein at least the conversion layer is severed.

We further provide a method of producing optoelectronic components, including providing a carrier; arranging optoelectronic semiconductor chips on the carrier; forming a conversion layer for radiation conversion on the carrier, wherein the optoelectronic semiconductor chips are surrounded by th3 conversion layer; and carrying out a singulation process to form separate optoelectronic components, wherein at least the conversion layer is severed, wherein the providing carrier is a metallic carrier, and the carrier is structured into separate carrier elements after forming the conversion layer and before carrying out the singulation process.

Figure 1:
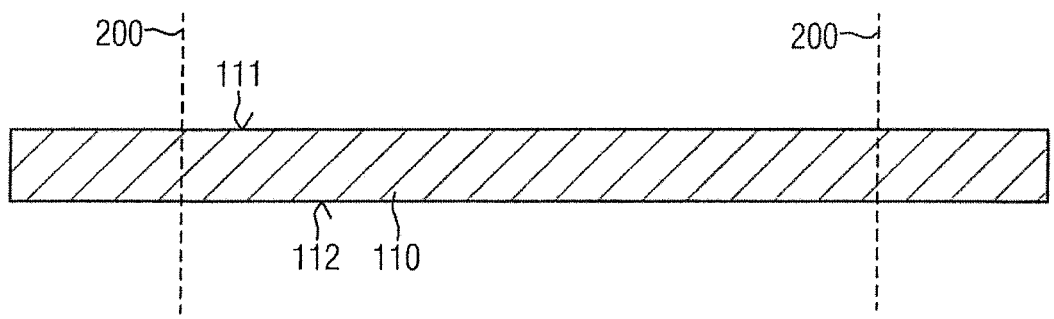
FIGS. 1 to 6 show one possible method sequence of producing optoelectronic components on the basis of lateral illustrations, including arranging optoelectronic semiconductor chips on a metallic carrier, wherein the semiconductor chips are volume emitters including two front-side contacts, connecting bond wires, forming a conversion layer enclosing the semiconductor chips on the carrier, structuring the carrier into separate carrier elements, and carrying out a singulation process.

LIST OF REFERENCE SIGNS 101, 102 Component
103, 104 Component
105, 106 Component
107 Component
110 Carrier
111 Front side
112 Rear side
113, 114 Carrier element
115, 116 Intermediate region
120 Reflective compound
130 Semiconductor chip
131, 132 Contact
139 Bond wire
140 Conversion layer
141 Front side
143 Lateral surface
151, 152 Component
160 Carrier
161 Front side
162 Rear side
170 Leadframe
171 Front side
172 Rear side
173, 174 Carrier element
175 Connection element
181, 182 Recess
183, 184 Etching region
190 Molding compound
200 Separating line
201, 202 Material thickness
210 Recess
211, 212 Partial region
220 Protection diode
230 Semiconductor chip

DETAILED DESCRIPTION

We provide a method of producing optoelectronic components. The method comprises providing a carrier, arranging optoelectronic semiconductor chips on the carrier, and forming a conversion layer for radiation conversion on the carrier, wherein the optoelectronic semiconductor chips are surrounded by the conversion layer. Provision is further made for carrying out a singulation process to form separate optoelectronic components, wherein at least the conversion layer is severed.

Compared to the conventional procedure of forming a molded body with cavities, subsequently arranging semiconductor chips in the cavities and encapsulating the cavities, in the method optoelectronic semiconductor chips arranged on a carrier are encapsulated with a continuous or uninterrupted conversion layer. In this case, the conversion layer constitutes a housing body or molded body extending to the front side and to the circumference of the semiconductor chips and enclosing the semiconductor chips. In this way, it is possible to provide small distances between the semiconductor chips, as a result of which a component assemblage having a high component density may be realized. This makes it possible to carry out the method with low(er) process costs. In a corresponding manner, the components formed by singulating the assemblage may have a small and compact structural size. The method furthermore enables batch processing.

Forming the conversion layer adjoining the front side and the circumference of the optoelectronic semiconductor chips and enclosing the semiconductor chips instead of forming a molded body with cavities in which semiconductor chips are subsequently arranged furthermore has the consequence that no disturbing residues of a molding compound are present. Therefore, a cleaning step that removes such residues (deflashing), and problems associated therewith may be obviated.

It is furthermore advantageous that the method may be carried out without great complexity and in a flexible manner with different chip arrangements.

The optoelectronic semiconductor chips used in the method are configured to generate radiation. The semiconductor chips may be, for example, light emitting diode chips (LEDs) that emit radiation or light radiation. The semiconductor chips may comprise component parts such as a semiconductor layer sequence having an active zone that generates radiation and contacts. Via the contacts, the semiconductor chips may be contacted and the semiconductor chips may be supplied with electrical energy to generate radiation.

The optoelectronic components produced in accordance with the method may be QFN packages (Quad Flat No Leads) suitable for surface mounting (SMT, Surface-Mounting Technology). Each component may comprise a section of the conversion layer. Furthermore, the components may comprise one or a plurality of optoelectronic semiconductor chips, wherein the semiconductor chip(s) is/are encapsulated with the associated section of the conversion layer.

The conversion layer configured for radiation or volume conversion may at least partly convert the light radiation emitted by the semiconductor chip(s) of a component during operation. For this purpose, the conversion layer may comprise phosphor particles. A light radiation having a predefined color may be generated in this way.

It is possible, for example, that the semiconductor chips are configured to generate blue or ultraviolet light radiation, and that the optoelectronic components may emit white light radiation on account of the radiation conversion. Alternatively, light radiations having other colors or spectral ranges may be taken into consideration for the semiconductor chips and/or components. During operation of a component, radiation may be emitted via the associated section of the conversion layer.

Further possible examples of the method are described below.

The provided carrier serving as a substrate may be a planar or plate-shaped carrier. The carrier may have two opposite main sides or a front side and a rear side. Arranging the optoelectronic semiconductor chips and forming the conversion layer may be carried out on a front side of the carrier. The carrier may at least partly comprise a metallic material.

The provided carrier may be a metallic carrier. The metallic carrier is structured into separate metallic carrier elements after forming the conversion layer and before carrying out the singulation process. This example of the method may be carried out relatively cost-effectively and affords the advantages mentioned below.

Structuring the metallic carrier into the separate carrier elements that takes place before the singulation makes it possible that severing of metallic carrier material may be obviated in the singulation process. Just the conversion layer may be severed for the purpose of singulation. A simple and fast separating process is possible as a result. Instead of a sawing process, some other more cost-effective process, for example, laser separation, water jet separation, cutting, stamping and the like, may be carried out.

Furthermore, the metallic carrier may be structured such that the carrier elements are at a small distance from one another. Connection structures that take up space such as are used in a leadframe to hold together terminal elements, are not present in this case. Therefore, structuring the metallic carrier into the carrier elements affords the possibility of realizing a component assemblage having a relatively high packing density.

The metallic carrier that may be formed in a plate-shaped fashion may have a greater stability compared to a leadframe. As a result, it is possible for the metallic carrier to be made thinner than a leadframe. Consequently, the optoelectronic components may be realized with a small structural height.

The use of the metallic carrier provided with the semiconductor chips and the conversion layer makes it possible, moreover, to avoid rear-side contamination of the carrier and thus of the carrier elements constituted from the carrier.

The separate carrier elements emerging from the metallic carrier may form terminal elements or connection pads of the optoelectronic components. In this way, the components may be soldered onto a circuit board.

The metallic carrier may be structured, for example, such that the optoelectronic semiconductor chips previously arranged on the carrier are located in each case on two carrier elements. Furthermore, it is possible, by the singulation, to form, for example, single-chip components each comprising one semiconductor chip arranged on two carrier elements. Such components may have a compact construction.

In a further example, structuring the metallic carrier comprises carrying out an etching process. Simple structuring of the carrier is possible as a result. The etching process, which may be a rear-side etching process, involves the use of a suitable etching mask, for example, a photomask. The etching process may furthermore be a cost-effective wet-chemical etching process.

In a further example, after structuring the metallic carrier, a reflective compound is arranged in intermediate regions between the carrier elements. In this way it is possible to avoid emission of radiation on the rear side and an associated loss of light during operation of the optoelectronic components. In this configuration, severing not only the conversion layer but also the reflective compound may be carried out in the singulation process. The reflective compound may comprise a basic material such as, for example, silicone and reflective particles composed of TiO2, for example, contained therein.

The provided metallic carrier may be an unstructured carrier. In an alternative example thereto, the provided metallic carrier comprises recesses. In this case, the conversion layer formed on the carrier is also arranged in the recesses. In this way, the recesses of the carrier enable an anchoring and, as a result, an improved fixing of the conversion layer on the carrier and, as a result, also on the separate carrier elements constituted therefrom. The recesses serving as anchoring structures, which recesses may extend between the main sides of the plate-shaped carrier may be formed, for example, by etching, stamping or the use of a laser in the carrier. The recesses may have, for example, a shape widening in a stepped fashion. The optoelectronic components may be fabricated such that recesses filled with the conversion layer are present at the edge of the components.

Instead of a plate-shaped metallic carrier, a different carrier may also be used in the method.

In this regard, in accordance with a further example, the provided carrier comprises a metallic leadframe and a molding compound. In this case, providing the carrier comprises providing the leadframe and molding the molding compound around the leadframe such that the carrier comprises a planar front side and a planar rear side. Both the front side and the rear side are constituted of the leadframe and the molding compound.

The provided metallic leadframe may comprise carrier elements and connection structures or connection elements connecting the carrier elements. The molding compound closes interspaces of the leadframe (that is to say between the carrier and connection elements). In this way, the carrier constituted of molding the molding compound around the leadframe may have a plate-shaped configuration having planar front and rear sides. Furthermore, with the aid of the molding compound it is possible to suppress emission of radiation on the rear side and an associated loss of light during the operation of the optoelectronic components.

The carrier comprising the leadframe and the molding compound is subsequently provided with the optoelectronic semiconductor chips and the conversion layer. In this case, it is likewise possible to realize a component assemblage having a high packing density. The subsequent singulation of the assemblage may involve severing the conversion layer, the leadframe and/or the connection elements of the leadframe and the molding compound. In the case of the optoelectronic components fabricated in this way, the carrier elements of the leadframe may form terminal elements or connection pads of the components. In this way, the components may be soldered onto a circuit board.

With regard to the abovementioned example, too, it is possible to form compact single-chip components each comprising one semiconductor chip arranged on two carrier elements.

The use of the carrier comprising the leadframe and the molding compound and on which the semiconductor chips and the conversion layer are arranged likewise makes it possible to avoid rear-side contamination of the carrier elements of the leadframe.

Different shapes of the carrier elements and different chip arrangements may be realized by different configurations of the leadframe. Provided that the external dimensions of the carrier to be produced in each case remain the same, the molding-around process may be carried out in each case with the same tool.

Molding the molding compound around the metallic leadframe may be carried out, for example, with the aid of a transfer molding process.

The molding compound used may comprise a basic material and a particulate filler contained in the basic material. The basic material may be, for example, epoxy, acrylate or silicone. Epoxy or acrylate may be used when semiconductor chips having a low radiation power are used. Silicone, which may have greater radiation stability and greater thermal stability, may be used in semiconductor chips having a high radiation power. The filler may comprise, for example, particles composed of amorphous SiO2 and/or AlO2. On account of the filler, the molding compound may have a low coefficient of thermal expansion adapted to the coefficient of expansion of the leadframe. The filler particles may have different particle sizes, as a result of which a high packing density may be present.

With regard to the molding compound, in accordance with a further example, the molding compound is a reflective molding compound. In this configuration, the molding compound additionally comprises reflective particles, for example, composed of TiO2 and/or AlO2. In this way, it is possible to avoid emission of radiation on the rear side and an associated loss of light during operation of the optoelectronic components with a high reliability.

Providing the metallic leadframe may comprise providing a metallic initial layer and structuring the initial layer into the leadframe. The structuring may be carried out, for example, by stamping or by a laser processing. Etching is also possible.

In this context, in accordance with a further example, providing the leadframe comprises providing a metallic initial layer and front-side and rear-side etching of the metallic initial layer. In this case, the structure etched from the front side may be a different structure than that etched from the rear side. A toothing and, as a result, an improved fixing of the molding compound on the leadframe are made possible in this way.

The provided leadframe may comprise, as indicated above, carrier elements and connection elements connecting the carrier elements. With regard to the above-described front- and rear-side etching, in accordance with a further example in each case in the area of a circumferential edge of a carrier element etching is carried out alternately in front-side and rear-side etching regions. A toothing and, as a result, an anchoring of the molding compound on the leadframe may be fostered further as a result.

With regard to the configuration of the provided leadframe comprising carrier elements and connection elements and the front- and rear-side etching, in accordance with a further example provision is made to provide the leadframe such that the connection elements are located in the area of a front side of the leadframe. As indicated above, severing the conversion layer, of the connection elements of the leadframe and the molding compound may be carried out in the singulation process. What may be achieved by the arrangement of the connection elements in the area of the front side of the leadframe is that no rear-side burrs are formed during the severing of the connection elements.

Various configurations may be taken into consideration for the process of forming the conversion layer carried out after arranging the optoelectronic semiconductor chips on the carrier. The conversion layer may be formed on the carrier, for example, such that the conversion layer enclosing the semiconductor chips is plane or comprises a planar front side.

In a further example, forming the conversion layer on the carrier comprises carrying out a molding process. This may be a compression molding process.

Furthermore, a cost-effective potting process may also be employed to form the conversion layer. Before potting, a frame may be arranged on the carrier. Afterward, a region enclosed by the frame may be filled with material of the conversion layer.

The conversion layer may comprise a radiation-transmissive basic material and phosphor particles for radiation conversion that are contained therein. The basic material may be silicone, for example.

In a further example, the conversion layer additionally comprises a filler besides the basic material and the phosphor particles. This may involve particles composed of amorphous SiO2, for example. An increased thermal conductivity and hence a cooling of the phosphor particles may be made available on account of the filler. This results in a higher efficiency during operation of the optoelectronic components. A further effect is a low coefficient of thermal expansion of the conversion layer. Furthermore, the conversion layer equipped with the filler may have a high robustness. In the case of an optoelectronic component fabricated in accordance with the method, the conversion layer or a section of the conversion layer may form a significant part of the outer sides of the optoelectronic component. The high robustness makes it possible to suppress the risk of damage to a component.

The effects mentioned above may be clearly manifested if the conversion layer is highly filled, i.e., comprises a high proportion of filler, for example, a proportion of more than 60% by weight, and different particle sizes of the filler are present to enable a high packing density. Forming a conversion layer having such properties may be realized with the aid of a compression molding process.

In a further example, the optoelectronic semiconductor chips are volume emitters. Such semiconductor chips may emit light radiation via a front side and via other sides such as, for example, lateral side flanks or side walls. During operation of an optoelectronic component, the light radiation emitted may be at least partly converted in the associated section of the conversion layer.

The semiconductor chips embodied as volume emitters may comprise a radiation-transmissive chip substrate composed of sapphire, for example. Furthermore, the semiconductor chips may comprise a mirror layer, for example, in the form of a DBR reflector (Distributed Bragg Reflector), at a rear side. Emission of radiation on the rear side may be avoided in this way. The use of sapphire volume emitters fosters a cost-effective fabrication of the optoelectronic components.

The semiconductor chips embodied as volume emitters may each furthermore comprise two front-side contacts. Contacting the front-side contacts of the semiconductor chips may be realized with the aid of suitable electrical connection structures, for example, bond wires. Forming the connection structures or bond wires may be carried out after arranging the semiconductor chips on the carrier and before forming the conversion layer. The electrical connection structures may connect to the contacts of the semiconductor chips and (depending on the method) to the metallic carrier (later structured into carrier elements) or carrier elements of the carrier comprising the leadframe and the molding compound.

Furthermore, other configurations are also possible for the optoelectronic semiconductor chips. By way of example, the semiconductor chips present as volume emitters may be so-called flip-chips comprising a radiation-transmissive chip substrate arranged on the front side and composed of sapphire, for example, and two rear-side contacts. The rear-side contacts of the semiconductor chips may connect to the carrier (i.e., to the metallic carrier or to carrier elements of the carrier comprising the leadframe and the molding compound) via a suitable electrical connection layer.

In a further example, the provided carrier comprises a reflective coating. With the aid of the reflective coating, an effective radiation reflection may be made available during the operation of an optoelectronic component. With the use of a metallic carrier, the coating may be provided on the metallic carrier or at least on a front side of the metallic carrier. In a configuration of the carrier comprising leadframe and molding compound, the leadframe or at least a front side of the leadframe may be provided with the coating.

Further features and details may furthermore be employed for the method. By way of example, components comprising a plurality of semiconductor chips may also be realized instead of single-chip components. The plurality of semiconductor chips may electrically connect to one another, for example, in series or in parallel. It is also possible that the semiconductor chips are electrically isolated from one another and may therefore be operated separately from one another.

An integration of other constituents or electronic component parts electrically connected to the semiconductor chip(s) of the components is furthermore possible. These include, for example, ESD protection diodes (electrostatic discharge) provided for protection against an electrostatic discharge. Such component parts may be arranged together with the semiconductor chips on the provided carrier, and correspondingly contacted and encapsulated with the conversion layer.

With the aid of the method it is possible to realize components whose semiconductor chips are arranged on two separate carrier elements or carrier elements separated by a gap. Alternatively, it is possible to produce components in which a semiconductor chip is located only on one carrier element.

In a further example of the method, instead of volume emitters it is also possible to use surface emitters, or thin-film emitter chips, in which light radiation may be emitted substantially via a front side. Such semiconductor chips may comprise a front-side contact and a rear-side contact, for example.

We also provide an optoelectronic component. The optoelectronic component is produced by carrying out the abovementioned method or one or more of the abovementioned examples of the method. The optoelectronic component may therefore have, for example, low component costs and a small compact structural size.

The optoelectronic component may comprise a section of the conversion layer. In this case, the conversion layer section may form a front side and a part or significant part of a circumferential lateral surface of the component. During operation of the component, radiation may be emitted via the front side and laterally via the lateral surface.

The expression lateral surface, as used here, is synonymous with the lateral edge or edge region of the optoelectronic component. The lateral surface present between the front side and, relative thereto, an opposite rear side of the component is composed of all lateral outer sides or side flanks of the component. The component may have a rectangular contour in plan view, for example, such that the lateral surface may comprise four side walls adjoining one another at right angles.

The optoelectronic component fabricated in accordance with the method may furthermore comprise one or a plurality of optoelectronic semiconductor chips. The semiconductor chip(s) may be enclosed by the section of the conversion layer. Furthermore, the component may comprise a plurality of, or at least two, carrier elements on which the semiconductor chip(s) is/are arranged. An electrical connection between the semiconductor chip(s) and the carrier elements may be realized, for example, with the aid of bond wires.

In a further example, the optoelectronic component comprises a section of the conversion layer and (only) one optoelectronic semiconductor chip. The semiconductor chip is preferably surrounded by the conversion layer section such that a corresponding material thickness of the conversion layer section is present at a front side and at a circumference of the semiconductor chip. Such a configuration having a uniformly circumferential thickness of the conversion layer makes it possible that radiation may be emitted via the conversion layer section with a high color homogeneity across different emission angles during the operation of the component.

Aspects and details mentioned above with regard to the production method may also be applied to the optoelectronic component and, conversely, aspects and details mentioned with regard to the component may also be applied to the method.

The advantageous examples and developments as explained above and/or reproduced in the appended claims may be applied (apart, for example, in cases of clear dependencies or incompatible alternatives) individually or else in arbitrary combination with one another.

The above-described properties, features and advantages and the way in which they are achieved will become clearer and more clearly understood in association with the following description of examples explained in greater detail in association with the schematic drawings.

Possible examples of a method of producing optoelectronic components are described with reference to the following schematic figures. Achievable advantages are, inter alia, a reduction of process costs and the possibility of realizing a component assemblage having a high packing density. Moreover, the methods may be carried out with different chip arrangements and be adapted in a flexible manner and without great complexity with regard to production of different optoelectronic components.

In the method sequences described below, processes known from semiconductor technology and the fabrication of optoelectronic components may be carried out and materials that are customary in these fields may be used, and so they will be discussed only in part. In the same way, the components may be fabricated with further component parts and structures in addition to component parts shown and described. It is furthermore pointed out that the figures are merely of schematic nature and are not true to scale. In this sense, component parts and structures shown in the figures may be illustrated with exaggerated size or size reduction to afford a better understanding.

The schematic FIGS. 1 to 6 show a method of producing optoelectronic components 101. The components 101 are surface-mountable single-chip components realized in the form of QFN packages. Each component 101 comprises an optoelectronic semiconductor chip 130 that generates radiation. A schematic plan view illustration of a component 101 fabricated in accordance with the method, contours of component parts of the component 101 being indicated in the illustration, is shown supplementary in FIG. 7.

The method involves fabricating an assemblage comprising continuous components, which is subsequently singulated into the components 101. FIGS. 1 to 6 illustrate the method on the basis of lateral sectional illustrations. An excerpt from the assemblage or the conditions respectively present substantially in the area of one of the components 101 to be fabricated is shown in each case. The structures shown in the figures may be present alongside one another in a multiply repeating manner in a plane.

A repetition grid is indicated on the basis of dashed lines 200 in FIGS. 1 to 6. At the lines 200, severing for the purpose of singulating the component assemblage into the components 101 may also be carried out. Therefore, the lines 200 are referred to as separating lines 200 hereinafter.

The method involves providing a metallic carrier 110, which is shown in FIG. 1. The carrier 110, present in the form of a thin carrier plate or in the form of a thin carrier strip, comprises two opposite planar main sides 111, 112. The latter are referred to as front side 111 and rear side 112 hereinafter.

In one simple configuration, the plate-shaped metallic carrier 110 may be unstructured. Alternatively, a structured plate-shaped carrier may also be used, as will be explained in greater detail further below with reference to FIGS. 9, 10.

The plate-shaped carrier 110 may have a greater stability in comparison with a leadframe conventionally used. Therefore, it is possible to provide for the carrier 110 a thickness that is less than a thickness of a conventional leadframe (generally 200 to 300 μm). A small thickness of the carrier 110 makes it possible to etch as little carrier material as possible in an etching process carried out in a later method stage for the purpose of structuring the carrier 110 into carrier elements 113, 114 (cf. FIG. 5). Moreover, the components 101 may be realized with a small structural height. The carrier 110 may have, for example, a thickness of 100 μm or 100 to 150 μm. As a result, the carrier 110 may have a suitable stability. In principle, thicknesses in a range of, for example, 20 to 300 μm are also possible for the carrier 110. Furthermore, greater thicknesses, for example, of 0.5 mm are possible.

The carrier 110 may, for example, comprise Cu and be present in the form of a copper carrier or copper strip. It is also possible for the carrier 110 to comprise an alloy, for example, a Cu alloy, Fe alloy, Ni alloy or an Al alloy. Furthermore, the carrier 110 may be uncoated or alternatively coated (not illustrated). The coating, which may be provided only in the area of the front side 111 may, for example, provide a high reflectivity. A layer stack is suitable for this purpose, which layer stack may comprise, for example, an Ag layer and an underlying barrier layer, for example, composed of Ni. Such a coating may be produced, for example, by electroplating or by some other process such as, for example, a sputtering process or an electroless chemical deposition (electroless plating). The use of a reflective coating makes it possible, during operation of an optoelectronic component 101, to bring about an effective reflection of radiation emitted in the direction of the carrier 110 or in the direction of carrier elements 113, 114 formed from the carrier 110.

Figure 2:
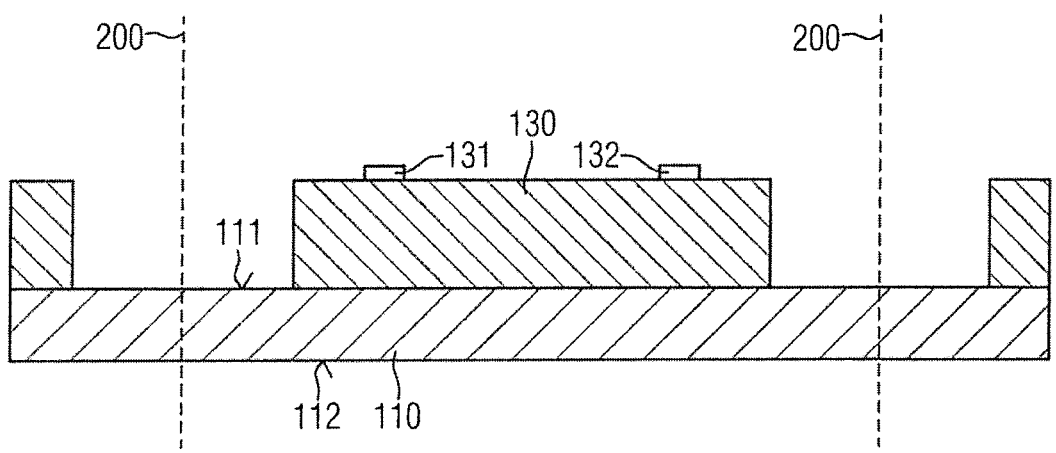

Afterward, as is shown in FIG. 2, optoelectronic semiconductor chips 130 configured to emit radiation are arranged on the front side 111 of the metallic carrier 110 (die bonding). A respective semiconductor chip 130 is provided for each of the components 101 to be produced. The semiconductor chips 130 may be light emitting diode chips or LED chips that emit light radiation, which are in the form of volume emitters. Mounting the chips 130 on the carrier 110 may be carried out with the aid of processes such as, for example, soldering, adhesive bonding or sintering. In this way, the chips 130 may connect to the carrier 110 via a connection layer (solder layer, adhesive layer, sintered layer) (not shown).

The optoelectronic semiconductor chips 130 embodied as volume emitters may emit the light radiation via a front side (side facing away from the carrier 110) and via other sides such as lateral side flanks. The semiconductor chips 130 comprise component parts (not shown) such as a radiation-transmissive chip substrate composed of sapphire, for example, and a semiconductor layer sequence having an active zone that generates radiation, the semiconductor layer sequence being arranged on the chip substrate on the front side. Furthermore, the semiconductor chips 130 comprise two front-side contacts 131, 132 arranged in the area of the front side. Via the front-side contacts 131, 132, electrical energy to generate radiation may be fed to the semiconductor chips 130.

Furthermore, the semiconductor chips 130 may comprise a mirror layer (not shown), for example, in the form of a DBR reflector (Distributed Bragg Reflector) at a rear side facing the carrier 110 or rear side of the radiation-transmissive chip substrate. This makes it possible to prevent the chips 130 from emitting light radiation on the rear side. The completed optoelectronic components 101 comprise an intermediate region or gap 115 (cf. FIG. 6). The configuration of the semiconductor chips 130 having the mirror layer has the effect that a direct rear-side emission of light radiation of the semiconductor chips 130 via the intermediate regions 115 may be suppressed during operation of the components 101.

The optoelectronic semiconductor chips 130, which later are encapsulated with a conversion layer 140 (cf. FIG. 4), may be arranged at small distances from one another on the plate-shaped carrier 110. This is fostered by the structuring of the carrier 110 into carrier elements 113, 114 (cf. FIG. 5), the structuring being carried out in a later method stage. It is thus possible to realize the component assemblage with a high packing density. This results in a cost-effective production of the optoelectronic components 101.

Figure 3:
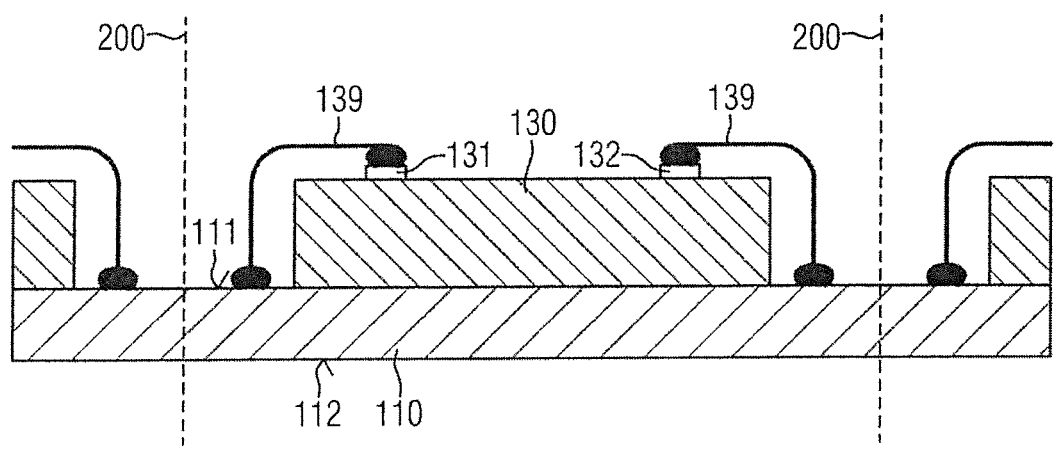

After mounting the semiconductor chips 130, as is shown in FIG. 3, forming or arranging bond wires 139 for the electrical wiring of the optoelectronic semiconductor chips 130 (wire bonding) is carried out. A bond wire 139 connects in each case to one of the contacts 131, 132 of a semiconductor chip 130 and, laterally with respect to the relevant semiconductor chip 130, to the metallic carrier 110 or the front side 111 thereof.

Figure 4:
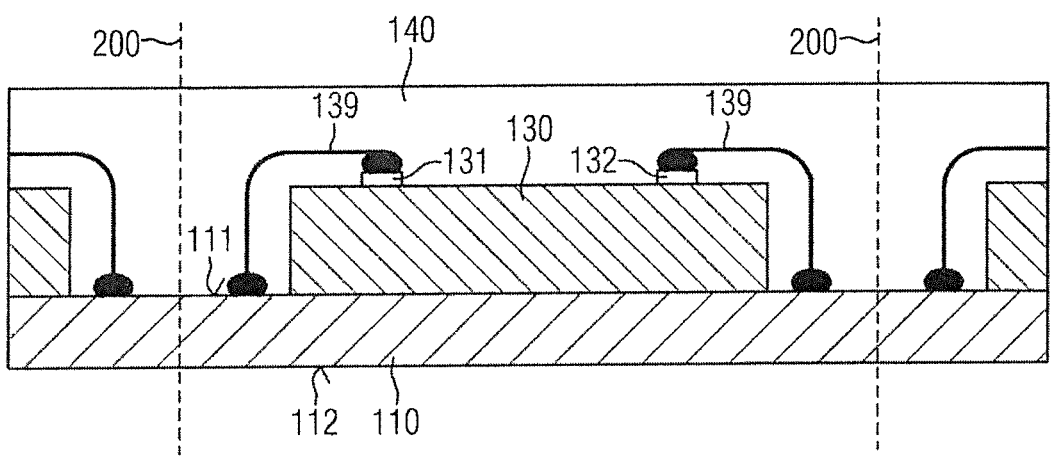

Afterward, as shown in FIG. 4, a continuous conversion layer 140 that is planar at a front side is formed on the front side 111 of the carrier 110. The conversion layer 140 extends to the front side and laterally to the semiconductor chips 130 and surrounds the semiconductor chips 130 and the bond wires 139. In this way, the conversion layer 140 constitutes a molded body arranged on the carrier 110 and encapsulating the semiconductor chips 130 and the bond wires 139.

Since the carrier 110 comprises a continuous or closed form, no rear-side contamination of the carrier 110 with material of the conversion layer 140 occurs in this process. Therefore, no complex (costly) cleaning process to remove residues (deflashing) is required.

A radiation or volume conversion of the light radiation that may be emitted by the optoelectronic semiconductor chips 130 may be effected with the aid of the conversion layer 140. In this way, the optoelectronic components 101 may generate a light radiation having a predefined color. The conversion layer 140 comprises a radiation-transmissive basic material such as silicone, for example, and phosphor particles that are contained therein and bring about the radiation conversion (not illustrated).

The conversion layer 140 furthermore comprises a particulate filler contained in the basic material (not illustrated), for example, particles composed of amorphous SiO2 (fused silica). By virtue of the filler particles, the conversion layer 140 may have an increased thermal conductivity and, consequently, a reliable cooling of the phosphor particles may be made possible during the operation of the optoelectronic components 101. An efficient mode of operation of the components 101 is possible as a result. A further advantage achievable with the aid of the filler is a low coefficient of thermal expansion of the conversion layer 140, as a result of which reliability problems may be avoided or suppressed.

Furthermore, the conversion layer 140 may have a high robustness and rigidity on account of the filler. In the completed optoelectronic components 101, the conversion layer 140 or a section thereof constitutes in each case a significant part of the outer sides of the components 101. The high robustness makes it possible for the risk of component damage to be kept small. In contrast, a conversion layer without a filler may be rubberlike, which may result in a high risk of component damage.

The advantageous effects described above may be significantly pronounced if the conversion layer 140 is formed as a highly filled conversion layer 140. In this case, the conversion layer 140 comprises a high proportion of filler and filler particles having mixed granulation or different particle sizes are present to achieve a high degree of filling. In the highly filled configuration, the filler may have, for example, a proportion by weight of more than 60% of the conversion layer 140.

Forming the conversion layer 140 enclosing the semiconductor chips 130 and bond wires 139 on the carrier 110 may comprise, for example, carrying out a compression molding process (also referred to as hot pressing). A suitable tool is used in this case. The conversion layer 140 highly filled with filler may be realized in this way.

To form the conversion layer 140 on the carrier 110, alternatively a potting process may also be carried out, which is cost-effective. In this case, a potting frame (not shown) is produced beforehand on the carrier 110. The frame may be formed by dispensing, for example. Afterward, a region enclosed by the frame is filled with material of the conversion layer 140, for example, by the use of a needle metering unit. In contrast to the compression molding process, however, only materials comprising a smaller proportion of filler, for example, comprising a proportion by weight of less than 60%, may be processed in the potting process.

Figure 5:
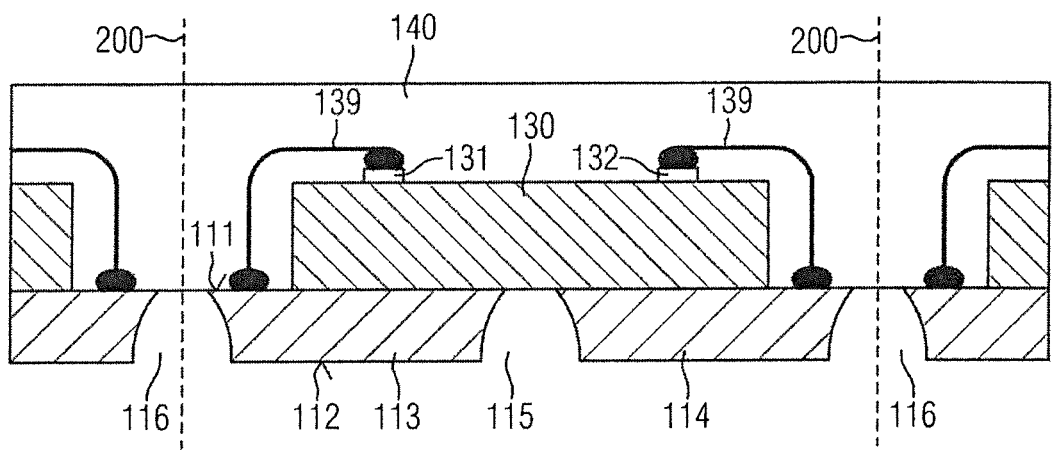

Afterward or after curing of the conversion layer 140, the carrier 110, as shown in FIG. 5, is structured into separate metallic carrier elements 113, 114. The carrier elements 113, 114 are separated from one another by intermediate regions or gaps 115, 116. In the structuring process, in each case a carrier element 113 and a carrier element 114 are produced for each of the optoelectronic components 101 to be fabricated, an intermediate region 115 being located between the carrier elements. An optoelectronic semiconductor chip 130 is located on the two carrier elements 113, 114 of a component 101 and thus projects over the associated intermediate region 115. The other intermediate regions 116 are located in the area of the separating lines 200 and thus between carrier elements 113, 114 of different components 101 to be produced.

Figure 7:
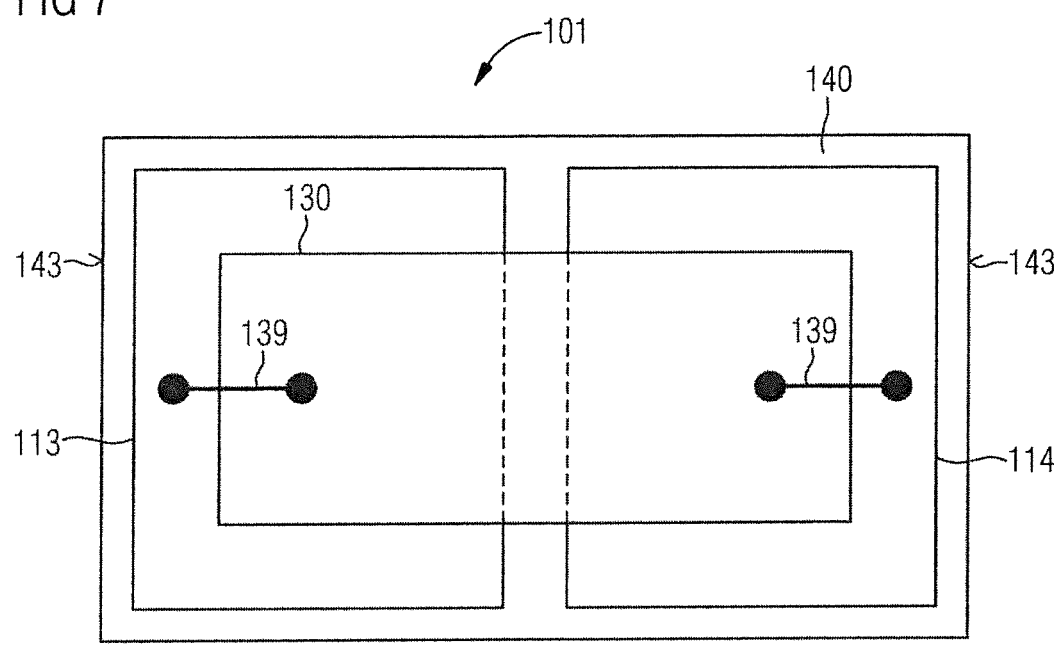
FIG. 7 shows a plan view illustration of a component fabricated in accordance with the method of FIGS. 1 to 6, wherein the component includes a semiconductor chip located on two carrier elements.

For each of the semiconductor chips 130 and thus for each of the components 101, in each case the bond wire 139 connected to the front-side contact 131, laterally with respect to the semiconductor chip 130, connects to the carrier element 113 and the bond wire 139 connected to the other front-side contact 132, laterally with respect to the semiconductor chip 130, connects to the carrier element 114 (in this respect, also cf. FIG. 7). In this way, the carrier elements 113, 114 in the components 101 may serve as terminal elements or connection pads to energize the contacts 131, 132 (via the bond wires 139). In this case, the intermediate regions 115 present between the carrier elements 113, 114 in the components 101 enable a separation of anode and cathode.

For the structuring, the carrier 110 is etched proceeding from the rear side 112 as far as the front side 111. The etching process is carried out with the aid of an etching mask (not shown) arranged on the rear side 112 and removed again after the etching process. By way of example, a photomask may be used as the etching mask. For this purpose, a photoresist layer may be applied on the rear side 112 and structured photolithographically (i.e., by exposure and development). It is also possible for the photomask to be applied by printing by screen or stencil printing. The etching process may be a wet-chemical etching process, as a result of which the isotropic rounded etched sidewalls shown in FIG. 5 may be present. Such an etching process may be carried out cost-effectively.

Figure 6:
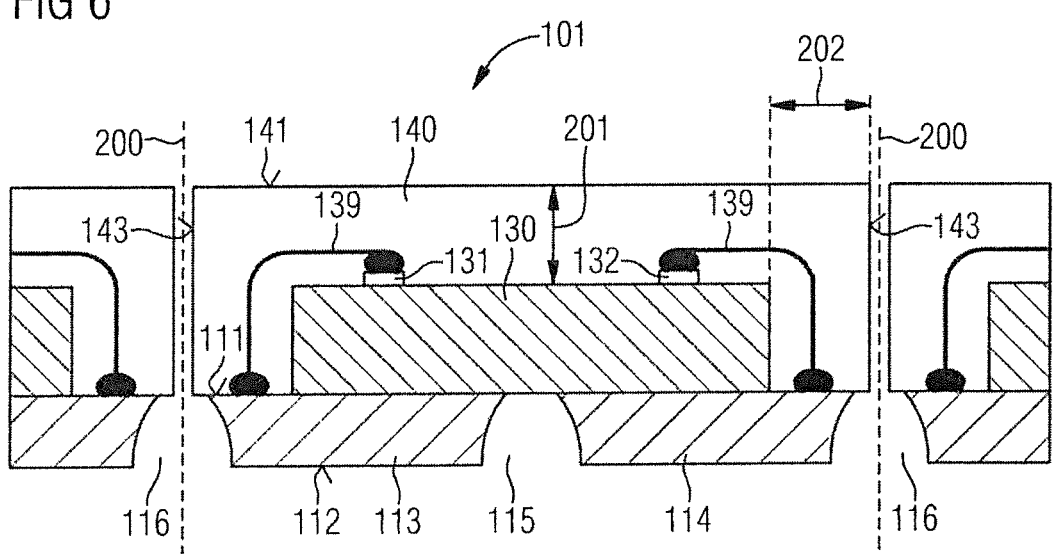

The component assemblage present after structuring the carrier 110 into the carrier elements 113, 114 is subsequently severed, as shown in FIG. 6. In this case, severing is carried out at the separating lines 200. Singulated optoelectronic components 101 are formed in this way. The presence of the separate carrier elements 113, 114 and of the intermediate regions 116 in the area of the separating lines 200 makes it possible to sever only the conversion layer 140. Simple and rapid singulation is thus possible. Instead of a sawing process, some other process, for example, cutting using a suitable cutting device, may be carried out. Further possible singulation processes are, for example, laser separation, water jet separation or stamping.

The singulated optoelectronic components 101 are present in the form of single-chip components. The components 101 have a compact construction and comprise in each case two carrier elements 113, 114, one optoelectronic semiconductor chip 130 located on the two carrier elements 113, 114, two bond wires 139 and a section of the conversion layer 140 that encloses the semiconductor chip 130 and the bond wires 139. With the aid of the carrier elements 113, 114 exposed on the rear side, the carrier elements serving as connection pads (bond pads), the components 101 may be arranged on a circuit board (not shown) by soldering or reflow soldering.

Via the carrier elements 113, 114 and the bond wires 139, electrical energy to generate radiation may be fed to the semiconductor chips 130 of the components 101. The radiation generated by the semiconductor chips 130 may be at least partly converted with the aid of the associated conversion layer sections 140. By way of example, it may be provided that the semiconductor chips 130 are configured to generate a blue or ultraviolet light radiation, and that the components 101 emit white light radiation on account of the radiation conversion.

In each optoelectronic component 101, the conversion layer section 140 via which the radiation emission of the component 101 may be effected constitutes a significant part of the outer surfaces of the component 101. The latter include a front side 141 and a significant part of a circumferential lateral surface 143 of the component 101. As shown in the plan view illustration in FIG. 7, the components 101 are formed with a rectangular contour. In this way, the lateral surface 143 may comprise four side walls adjoining one another at right angles. Moreover, the semiconductor chips 130 and the carrier elements 113, 114 may also have a rectangular contour.

In the optoelectronic components 101, the conversion layer section 140 is arranged around the associated semiconductor chip 130 such that the thickness of the conversion layer section 140 at each chip side, i.e., both at the front side and at the circumference of the chip 130, corresponds or is of approximately the same magnitude. To illustrate this construction, in FIG. 6 the material thickness at the front side of the chip 130 is indicated with the aid of a double-headed arrow 201, and the material thickness at the circumference or at the lateral side flanks of the chip 130 is indicated with the aid of a double-headed arrow 202. The use of volume emitters as semiconductor chips 130 and the configuration having corresponding material thicknesses 201, 202 make it possible to achieve a radiation emission with high color homogeneity across different emission angles during the operation of the components 101.

The material thicknesses 201, 202 may be 250 μm, for example. However, thicknesses of 100 to 500 μm are also possible. The choice of a layer thickness may be dependent on various boundary conditions or stipulations. A larger layer thickness may be linked with a more efficient radiation conversion. Moreover, it may be simpler to set a uniform layer thickness of the conversion layer 140. A smaller layer thickness may lead to a better cooling of the phosphor particles.

The optoelectronic components 101 may have a lateral component size of 1 mm×1.5 mm, for example, in a lateral chip size of 500 μm×1000 μm and a circumferential layer thickness of the conversion layer 140 of 250 μm.

Possible variants and modifications of the method explained with reference to FIGS. 1 to 7 are described below. Corresponding features and aspects and also identical and identically acting component parts will not be described in detail again hereinafter. Instead, for details in respect thereof, reference is made to the above description. Furthermore, attention is drawn to the possibility of combining with one another features of two or more of the examples described below in part with reference to further figures.

Figure 8:
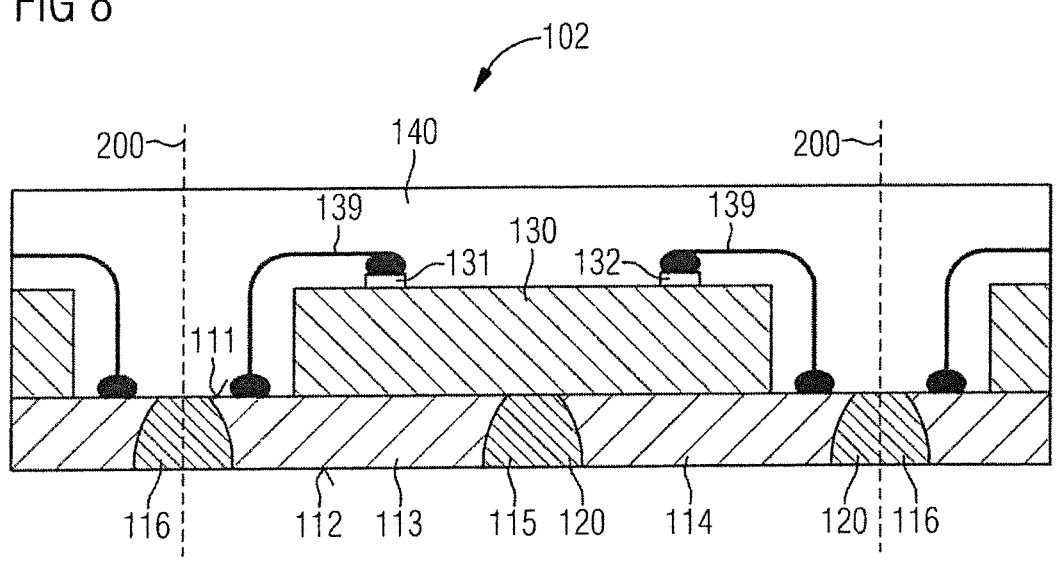
FIG. 8 shows a lateral illustration of a component assemblage present before singulation, wherein a reflective compound is additionally arranged in intermediate regions between the carrier elements.

One possible modification of the fabrication method consists, for example, of filling some or all of the etching cavities or intermediate regions 115, 116 at the rear side of the assemblage with a highly reflective compound 120 after the structuring of the plate-shaped carrier 110. This may be carried out by potting or carrying out a molding process. To illustrate this method variant, FIG. 8 shows a continuous assemblage comprising optoelectronic components 102 in which all the intermediate regions 115, 116 are filled. In the severing process subsequently carried out to singulate the components 102 (not illustrated), severing not only the conversion layer 140 but also the reflective compound 120 in the intermediate regions 116 may be carried out. The reflective compound 120 may comprise, for example, silicone and reflective particles composed of TiO2 contained therein (not illustrated). The use of the reflective compound 120 makes it possible to avoid emission of radiation on the rear side such that the components 102 may have a higher efficiency compared with the components 101.

It is also possible to fill only a portion of the intermediate regions 115, 116, for example, only the intermediate regions 115 located below the semiconductor chips 130, with the reflective compound 120.

Filling at least the intermediate regions 115 (and also, if appropriate, the intermediate regions 116) may be taken into consideration, for example, if semiconductor chips 130 without a rear-side mirror layer are used.

In a further method variant, at the beginning of the method, instead of an unstructured carrier a structured plate-shaped carrier 110 is provided and comprises recesses 210 extending through the carrier 110 between the main sides 111, 112 thereof. An anchoring of the conversion layer 140 formed later in the course of the method may be achieved in this way. The recesses 210 may, for example, be etched, stamped or introduced by laser into the carrier 110.

Figure 9:
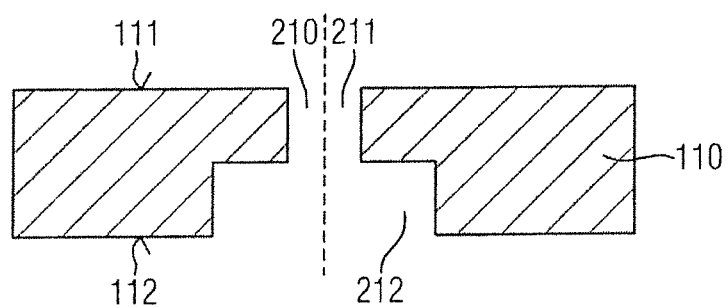
FIG. 9 shows as an excerpt a lateral illustration of a carrier, wherein the carrier includes a recess to anchor the conversion layer.

In this respect, FIG. 9 shows as an excerpt a prestructured or preetched carrier 110 formed in this way in the area of a recess 210. The recess 210 comprises a shape widening in the direction of the rear side 112 in a stepped manner with two partial regions 211, 212. The partial regions 211, 212, which may have a circular contour, have different lateral dimensions or diameters (cf. FIG. 10). The carrier 110 is provided with a multiplicity of such recesses 210.

When forming the conversion layer 140 on the carrier 110 equipped with such recesses 210, the recesses 210 may be filled with material of the conversion layer 140 (not illustrated). An anchoring and hence an improved fixing of the conversion layer 140 on the carrier 110 and thus also on the carrier elements 113, 114 constituted therefrom are made possible as a result. The recesses 210 may be positioned or the structuring of the carrier 110 may be carried out such that the recesses 210 or partial regions of the recesses 210 are arranged at the edge of the carrier elements 113, 114 constituted from the carrier 110 and, hence, also at the edge of singulated optoelectronic components.

Figure 10:
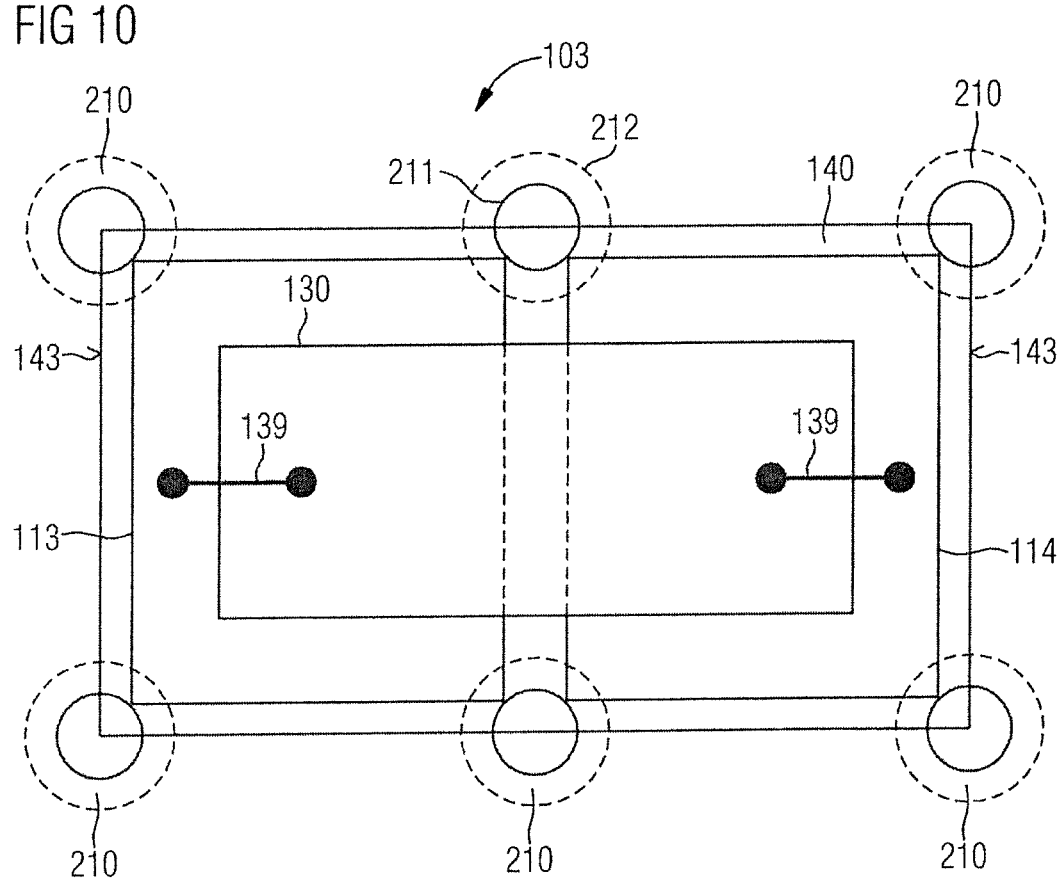
FIG. 10 shows a plan view illustration of a further component with an additional illustration of possible positions for recesses to anchor the conversion layer.

FIG. 10 shows a plan view illustration of an optoelectronic component 103 formed in accordance with this procedure. Possible positions of recesses 210 that may be present beforehand in the carrier 110, the carrier elements 113, 114 constituted therefrom, and the component assemblage before the singulation thereof are additionally indicated here. As shown in FIG. 10, the method may be carried out such that each component 103 comprises at the edge partial regions of six recesses 210 (four at the corners and two in the area of the centers of the longer edge sides). In this case, a "distribution" of the recesses 210 filled with the conversion layer 140 among a plurality of components 103 takes place in the course of the method.

The method may furthermore be carried out such that multi-chip arrangements or multi-chip components comprising a plurality of optoelectronic semiconductor chips 130 are formed instead of single-chip components. For this purpose, the method is carried out with a correspondingly adapted arrangement of semiconductor chips 130, contacting or wiring thereof, structuring of the carrier 110 into the carrier elements 113, 114, and singulation.

Figure 11:
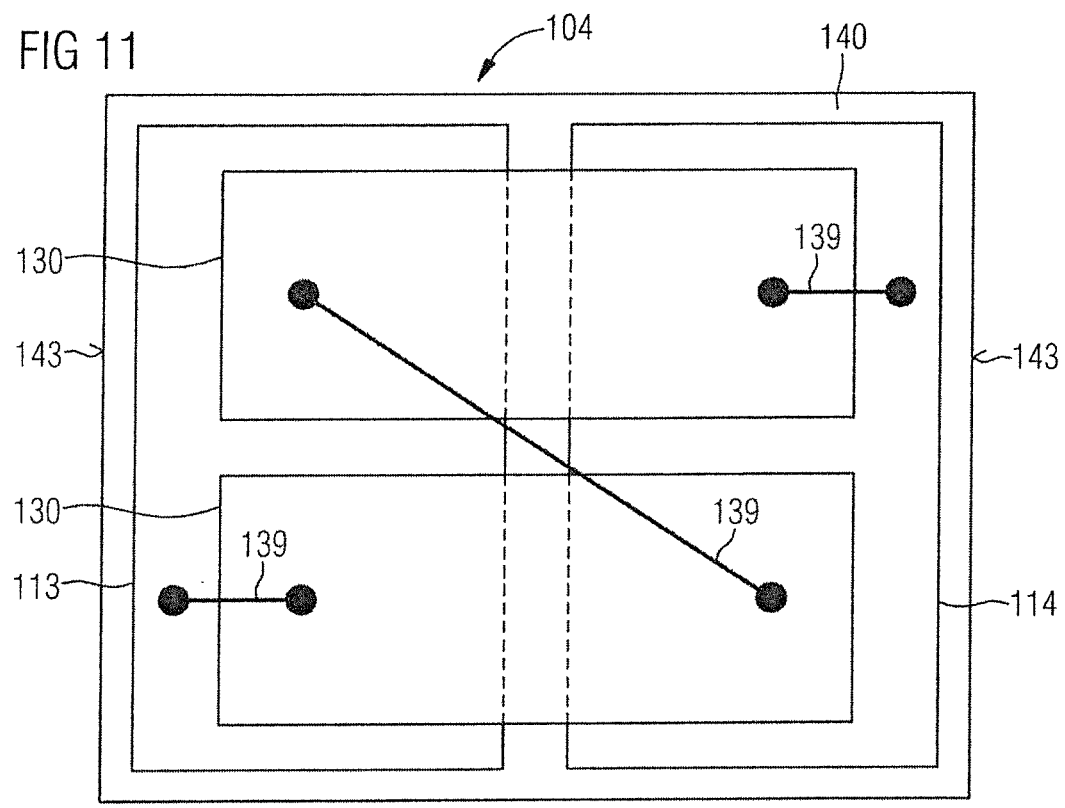
FIG. 11 shows a plan view illustration of a further component including two semiconductor chips connected in series.

For exemplary illustration, FIG. 11 shows a plan view illustration of a further optoelectronic component 104. The component 104 comprises two semiconductor chips 130 and two carrier elements 113, 114 formed with larger lateral dimensions compared to the carrier elements 113, 114 of a single-chip component 101. The two semiconductor chips 130 are arranged on the two carrier elements 113, 114 in a manner comparable with the chip 130 of the single-chip component 101 and therefore project over the gap-shaped intermediate region present between the carrier elements 113, 114 in this configuration as well.

Contacting front-side contacts of the semiconductor chips 130 of the component 104 is realized with the aid of bond wires 139 in this configuration as well. A front-side contact of one semiconductor chip 130 connects to the carrier element 113, and a front-side contact of the other semiconductor chip 130 connects to the carrier element 114. The other two front-side contacts of the two semiconductor chips 130 connect to one another directly via a further, longer bond wire 139 running diagonally in FIG. 11. The semiconductor chips 130 are interconnected in series in this way. Furthermore, the semiconductor chips 130 and bond wires 139 are enclosed by a section of the conversion layer 140.

The method may also be carried out such that optoelectronic components comprising more than two semiconductor chips 130 are fabricated (not illustrated). Furthermore, instead of a series connection it is also possible to realize a parallel connection, or else a mixed interconnection (combination of series connection and parallel connection) of semiconductor chips 130. Furthermore, components may be formed whose semiconductor chips 130 are not electrically connected to one another (not illustrated).

A further possible modification of the method consists of combining the optoelectronic semiconductor chips 130 with other electronic component parts. Such component parts may be arranged together with the semiconductor chips 130 on the provided plate-shaped carrier 110, and be wired and encapsulated with the conversion layer 140 before the structuring of the carrier 110 and the singulation are carried out. ESD protection diodes 220 may be involved here, for example, with the aid of which protection against an electrostatic discharge may be achieved.

Figure 12:
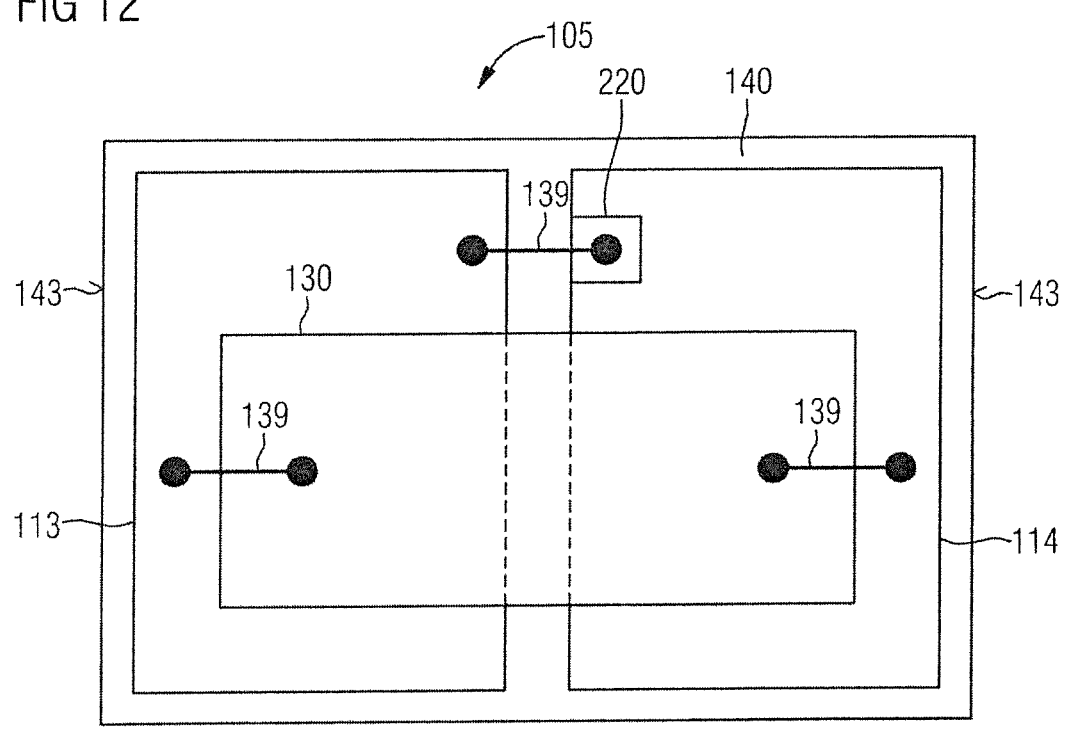
FIG. 12 shows a plan view illustration of a further component including a semiconductor chip and a protection diode.

In this context, FIG. 12 shows a plan view illustration of a further optoelectronic component 105. The component 105 comprises the same constituents as a component 101, and in addition a protection diode 220 arranged on the carrier element 114. The protection diode 220 comprises a front-side contact and a rear-side contact. The rear-side contact of the protection diode 220 is connected to the carrier element 114 via an electrically conductive connection layer. The front-side contact of the protection diode 220 connects to the other carrier element 113 via a bond wire 139. The protection diode 220 is also enclosed by the section of the conversion layer 140. On account of the use of the protection diode 220, the carrier elements 113, 114 in the case of the component 105 may be formed with larger lateral dimensions than in the component 101.

Figure 13:
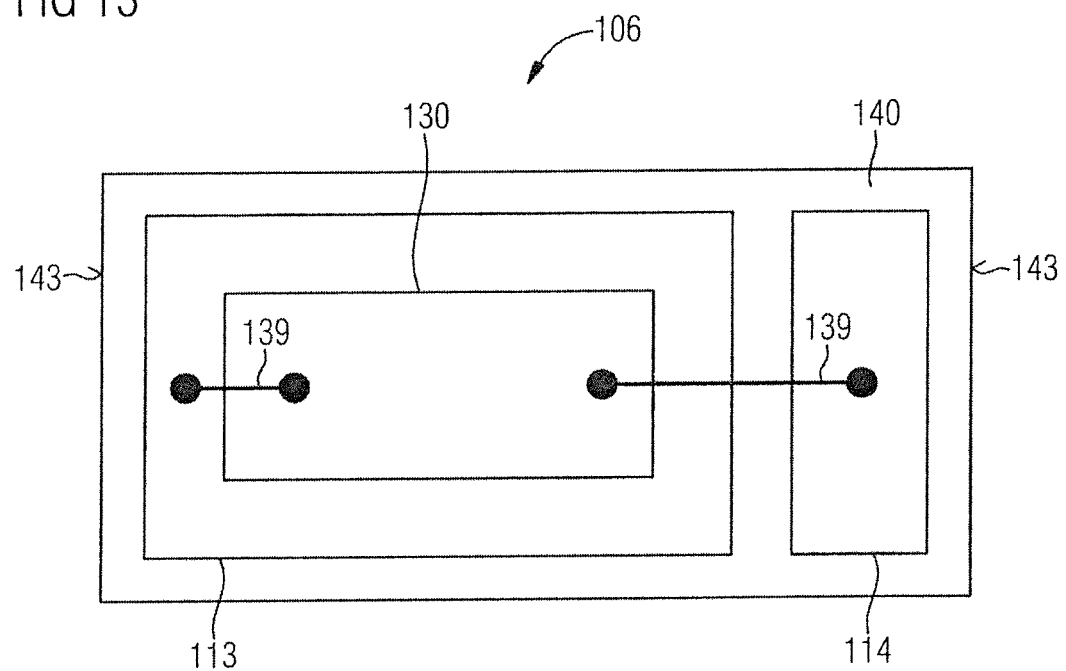
FIG. 13 shows a plan view illustration of a further component including a semiconductor chip arranged only on one carrier element.

FIG. 13 illustrates a further method variant on the basis of a plan view illustration of an optoelectronic component 106. In the component 106, which is a single-chip component, the semiconductor chip 130 is arranged only on one carrier element 113. The carrier element 113 comprises a shape adapted to the chip 130. One front-side contact of the semiconductor chip 130 connects via a bond wire 139 to the carrier element 113. The other front-side contact of the chip 130 connects via a further bond wire 139 to a further carrier element 114. In this case, the carrier element 114 provided only for the connection of the bond wire 139, as is shown in FIG. 13, may be significantly smaller than the carrier element 113 additionally used to carry the semiconductor chip 130.

Provision of a semiconductor chip 130 on one carrier element 113 rather than on two carrier elements 113, 114 with a gap therebetween is thermally advantageous and enables a (more) effective dissipation of heat from the semiconductor chip 130. However, this design, which may also be taken into consideration for multi-chip components, results in a larger component size.

In the method, other optoelectronic semiconductor chips or LED chips may also be employed instead of the semiconductor chips 130 (volume emitters having two front-side contacts). By way of example, volume emitters in the form of so-called flip-chips may be used. Such semiconductor chips comprise a radiation-transmissive chip substrate arranged on the front side and composed of sapphire, for example, a rear-side semiconductor layer sequence and two rear-side contacts (not illustrated).

When arranging such semiconductor chips on the carrier 110, the rear-side contacts may connect to the carrier 110 via a suitable electrically conductive connection layer (for example, a solder layer or a layer of an electrically conductive adhesive). Afterward or after forming the encapsulating conversion layer 140, the carrier 110 may be structured into separate carrier elements such that the rear-side contacts of a semiconductor chip are located in each case on two different carrier elements and are thereby electrically connected to different carrier elements (separation of anode and cathode). By the singulation of the component assemblage constituted in this way, single-chip components may be produced, for example. In this case, for example, an arrangement comparable to FIG. 7 or, with the use of a protection diode 220, comparable to FIG. 12, in each case without bond wires 139 at the associated flip-chip, may be present. Multi-chip components comprising a plurality of flip-chips may also be realized in the corresponding manner.

Figure 14:
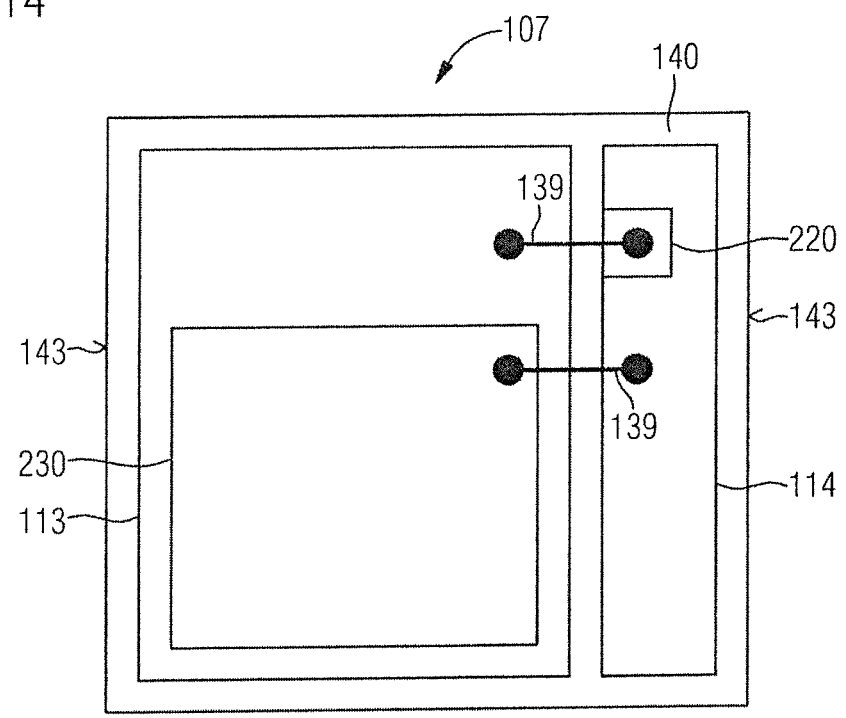
FIG. 14 shows a plan view illustration of a further component including a thin-film emitter chip and a protection diode.

Furthermore, it is possible to carry out the method using LED chips in the form of surface emitters or thin-film emitter chips. In the case of such semiconductor chips, radiation may be emitted substantially via a front side. For exemplary illustration, FIG. 14 shows a plan view illustration of a further optoelectronic component 107 producible by the method. The component 107 comprises a semiconductor chip 230 in the form of a thin-film emitter chip and an (optional) protection diode 220. The semiconductor chip 230, arranged on a carrier element 113, comprises a front-side contact and a rear-side contact. As in a flip-chip, the rear-side contact connects via a suitable electrically conductive connection layer to the carrier element 113 (and previously to the underlying carrier 110). The front-side contact of the semiconductor chip 230 connects via a bond wire 139 to a further carrier element 114, on which the protection diode 220 is also located. As in the component 105 from FIG. 12, the protection diode 220 connects to the carrier elements 113, 114. Furthermore, the semiconductor chip 230 and the protection diode 220 are encapsulated with a conversion layer section 140 in this configuration as well.

Production of the component 107 may be carried out analogously in the manner of an assemblage by semiconductor chips 230 (together with protection diodes 220) being arranged on the carrier 110 and wired, and then the formation of the conversion layer 140, structuring of the carrier 110 into carrier elements 113, 114 and the singulation being carried out. Here, too, one possible modification consists, for example, of forming multi-chip chip components comprising a plurality of semiconductor chips 230.

FIGS. 15 to 20 show a further method of producing surface-mountable optoelectronic components 151 on the basis of schematic lateral sectional illustrations. The components are present in the form of single-chip components and comprise a radiation-emitting optoelectronic semiconductor chip 130. The method involves fabricating a continuous component assemblage and then singulating it into the components 151.

FIGS. 15 to 20 show in each case an excerpt from the assemblage or the conditions respectively present substantially in the area of one of the components 151 to be fabricated. The structures shown in the figures may be present alongside one another in a multiply repeating manner in a plane. A repetition grid is indicated with the aid of separating lines 200. A schematic plan view illustration of a component 151 which indicates contours of component parts of the component 151 is supplementary shown in FIG. 21. In the method, the processes, component parts of components and materials used in part are the same as those described above. Therefore, the above description may in part also be applied to this method (and the possible modifications thereof).

Figure 15:
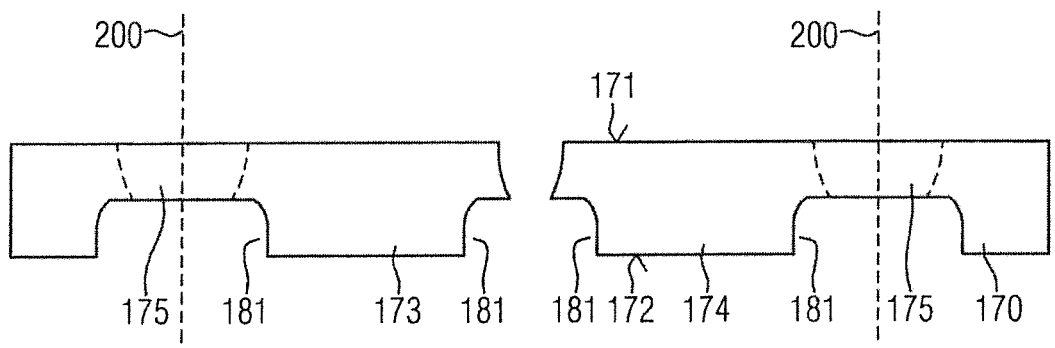
FIGS. 15 to 20 show a further method sequence of producing optoelectronic components on the basis of lateral illustrations, including providing an etched leadframe including carrier elements and connection elements, molding a molding compound around the leadframe to provide a carrier, arranging optoelectronic semiconductor chips on the carrier, wherein the semiconductor chips are volume emitters including two front-side contacts, connecting bond wires, forming a conversion layer enclosing the semiconductor chips on the carrier, and carrying out a singulation process.

In the method described below, instead of a plate-shaped metallic carrier 110, a plate-shaped carrier 160 is used and comprises a metallic leadframe 170 with a molding compound 190 molded around the latter (cf. FIG. 16). Therefore, the method involves first providing the metallic leadframe 170, which is shown in FIG. 15. The leadframe 170 comprises two carrier elements 173, 174 for each of the components 151 to be produced. With regard to production in the manner of an assemblage, this pairwise structure comprising two carrier elements 173, 174 is present in a multiply repeating manner. The carrier elements 173, 174 of different components 151 to be fabricated connect to one another with the aid of web-shaped connection structures 175, referred to as connection elements 175 hereinafter.

The connection elements 175 are located in the area of the separating lines 200. During singulation of the assemblage, the connection elements 175 of the leadframe 170 are severed such that the carrier elements 173, 174 assigned to the respective components 151 are electrically isolated from one another (separation of anode and cathode, cf. FIG. 20). The connection webs 175 may be small and filigree such that as little leadframe material as possible has to be severed.

The leadframe 170 comprising the carrier elements 173, 174 and connection elements 175 may be formed by structuring a metallic initial layer, for example, a copper layer. The figures indicate a procedure in which the initial layer is etched wet-chemically both proceeding from a front side 171 and proceeding from a rear side 172 opposite thereto. The characteristic isotropic rounded etched sidewalls shown in the figures are formed as a result of the etching on both sides or half-etching from two sides, which is carried out using corresponding etching masks.

During the structuring of the leadframe 170, partly a different structure is etched from the front side 171 than from the rear side 172. The structuring is carried out such that the connection elements 175 of the leadframe 170 are located in the area of the front side 171. What may be achieved as a result is that no rear-side burrs are formed during severing of the connection elements 175. Furthermore, the carrier elements 173, 174 comprise stepped edge sides and circumferential recesses 181 in the area of the rear side 172.

FIG. 15 shows two connection elements 175, via which the two carrier elements 173, 174 shown completely in sectional view in FIG. 15 connect to respectively adjacent carrier elements, which are only partly depicted. Furthermore, with the aid of dashed lines, marginal contours of the carrier elements 173, 174 are indicated, which may be present in a manner laterally offset with respect to the connection elements 175 (i.e., into the plane of the drawing of FIG. 15 or out of the latter).

Figure 21:
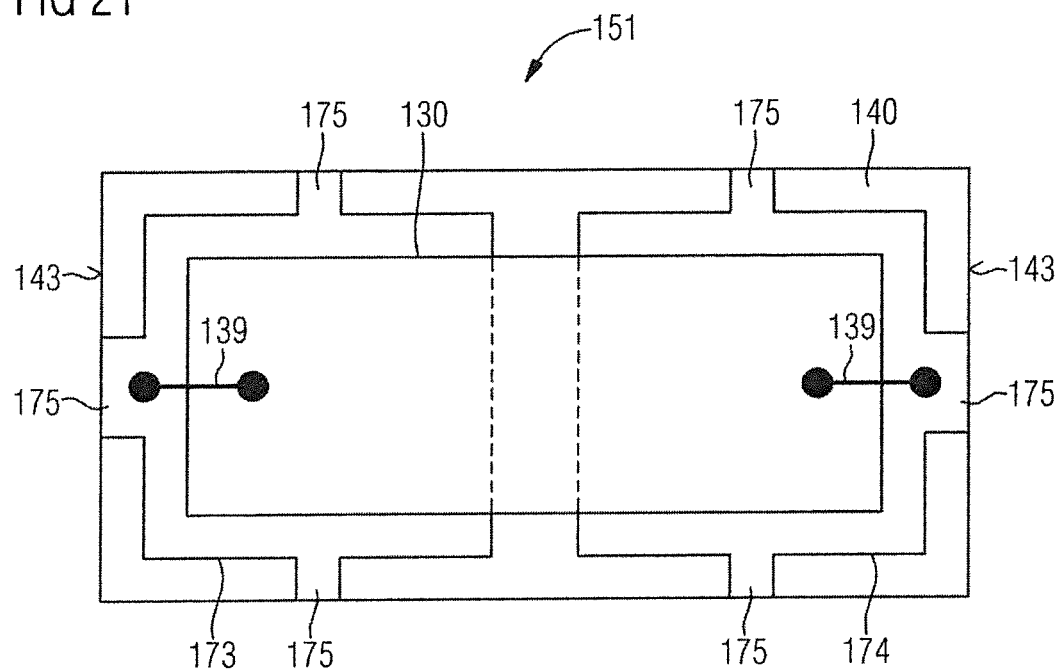
FIG. 21 shows a plan view illustration of a component fabricated in accordance with the method in FIGS. 15 to 20, wherein the component includes a semiconductor chip located on two carrier elements.

In this context, reference is supplementary made to the plan view illustration in FIG. 21, on the basis of which one possible form of the carrier elements 173, 174 becomes clear. The carrier elements 173, 174 of a component 151 to be fabricated have a rectangular shape in plan view and, apart from the edge sides facing one another, at the other three edge sides in each case merge into a corresponding connection element 175. FIG. 21 illustrates a component 151 that has already been singulated such that the sections of severed connection elements 175 present at the component 151 are shown. Before the singulation, the two carrier elements 173, 174 shown in FIG. 21 connect via the connection elements 175 to carrier elements of adjacent components to be fabricated.

The leadframe 170 (and thus also the carrier 160 subsequently produced) may have, for example, a thickness of 150 to 300 Thicknesses of 50 to 500 for example, are also possible.

Instead of copper, other leadframe materials may also be taken into consideration. They include, for example, copper alloys, iron and iron alloys, and aluminum alloys. With regard to the last-mentioned configuration, alloys comprising nickel are possible, for example, as a result of which the leadframe 170 may have a small coefficient of thermal expansion. Sintered composite materials such as CuMo or CuW, for example, are also possible.

After structuring the initial layer, consideration may furthermore be given to providing the leadframe 170 with a coating (not illustrated), for example, by electroplating or by some other process such as, for example, a sputtering process or an electroless chemical deposition at least in the area of the front side 171. The coating may serve, for example, to provide a high reflectivity. By way of example, a layer stack comprising an Ag layer and an underlying Ni barrier layer is suitable. A reflective coating makes it possible, during operation of a component 151 to bring about an effective reflection of radiation emitted in the direction of the leadframe 170 or the carrier elements 173, 174.

Figure 16:
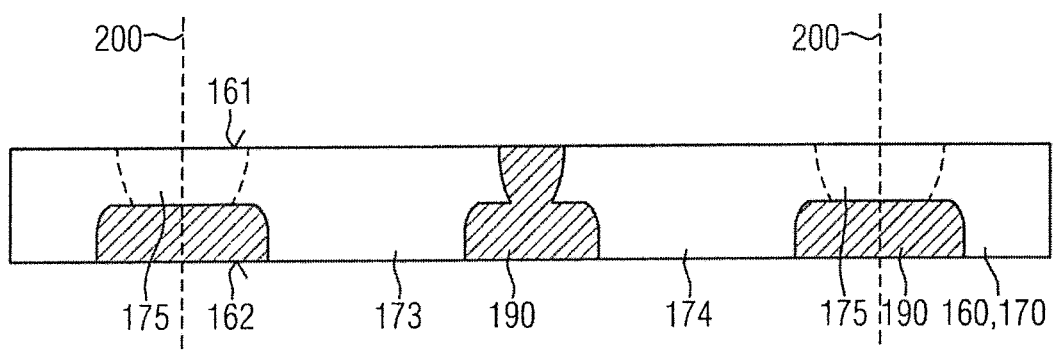

Afterward, the molding compound 190 is molded around the metallic leadframe 170 such that the plate-shaped carrier 160 shown in FIG. 16 is provided. The molding compound 190 closes interspaces between the carrier elements 173, 174 and connection structures 175 of the leadframe 170. For molding around the leadframe 170, a transfer molding process may be carried out with the aid of a suitable tool. The molding-around process is carried out such that both the front side 171 of the leadframe 170 terminates flush with the front side of the molding compound 190 and the rear side 172 of the leadframe 170 terminates flush with the rear side of the molding compound 190. Therefore, the molding-around process may also be referred to as flat molding. The carrier 160 thus comprises a planar front side 161 and a planar rear side 162, which are both constituted by the leadframe 170 and the molding compound 190. Since different structures were etched from the front and rear sides during the structuring of the leadframe 170, a toothing and hence reliable fixing of the molding compound 190 to the leadframe 170 are possible.

The molding compound 190 may comprise a basic material and a particulate filler contained in the basic material (not illustrated), for example, particles composed of amorphous $SiO_2$ (fused silica) and/or $AlO_2$. The basic material may be epoxy, acrylate or silicone, for example. The two materials mentioned first may be used in the case where semiconductor chips 130 having a low radiation power are used. In semiconductor chips 130 having a high radiation power, it is possible to use silicone, which is thermally stable and radiation-stable in relation to short-wave light radiation. On account of the filler, the molding compound 190 may have a small coefficient of thermal expansion adapted to the coefficient of expansion of the leadframe 170. The filler particles have different particle sizes or a distribution of particle sizes such that the greatest possible packing density is achievable.

The molding compound 190 may furthermore comprise reflective particles, for example, composed of TiO2 and/or AlO2 (not illustrated). As a result, the molding compound 190 may have a white color and it is possible to avoid emission of radiation on the rear side and an associated loss of light during the operation of the optoelectronic components 151 with a high reliability.

Figure 17:
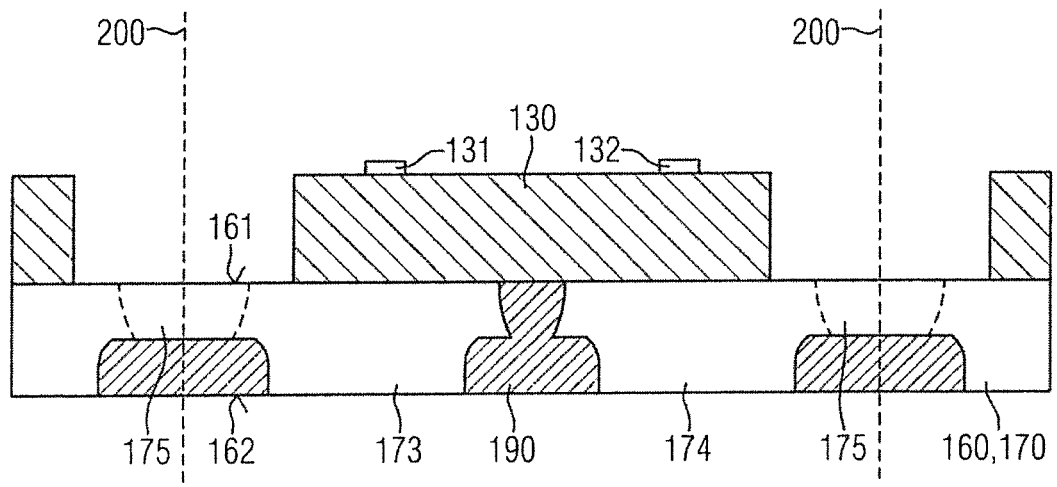

Afterward, or after curing the molding compound 190, as is shown in FIG. 17, radiation-emitting optoelectronic semiconductor chips 130 are arranged on the front side 161 of the carrier 160. A respective semiconductor chip 130 is provided for each of the components 151 to be fabricated. In this case, a semiconductor chip 130 is respectively arranged on the two carrier elements 173, 174 of a component 151 such that the relevant semiconductor chip 130 is also located on the molding compound 190 present therebetween. Mounting the semiconductor chips 130 on the carrier 160 may be carried out by adhesive bonding, for example. In this way, the chips 130 may connect to the carrier 160 via an adhesive layer (not shown). To enable a high reliability of the components 151, a light- or radiation-stable adhesive having a high thermal conductivity is used.

The semiconductor chips 130 may be LED chips that may be realized in the form of sapphire volume emitters having the construction described above. The semiconductor chips 130 comprise two front-side contacts 131, 132. The semiconductor chips 130 may comprise a mirror layer (for example, DBR reflector) (not shown) at a rear side facing the carrier 160, as a result of which emission of radiation on the rear side may be avoided. As a result, it is possible to significantly reduce irradiation of the molding compound 190 located between the carrier elements 173, 174 during operation of the optoelectronic components 151.

Given a corresponding configuration of the leadframe 170, the optoelectronic semiconductor chips 130 may be arranged at small distances from one another on the carrier 160. It is therefore possible to realize a component assemblage having a high packing density.

It is furthermore advantageous that different forms of carrier elements 173, 174 and different chip arrangements only require a corresponding configuration of the leadframe 170. Provided that the external dimensions of the carrier 160 to be produced remain the same, the above-described process of molding the molding compound 190 around the leadframe 170 may be carried out in each case using the same tool. The external dimensions of the carrier 160 may be 125 mm×70 mm, for example.

Figure 18:
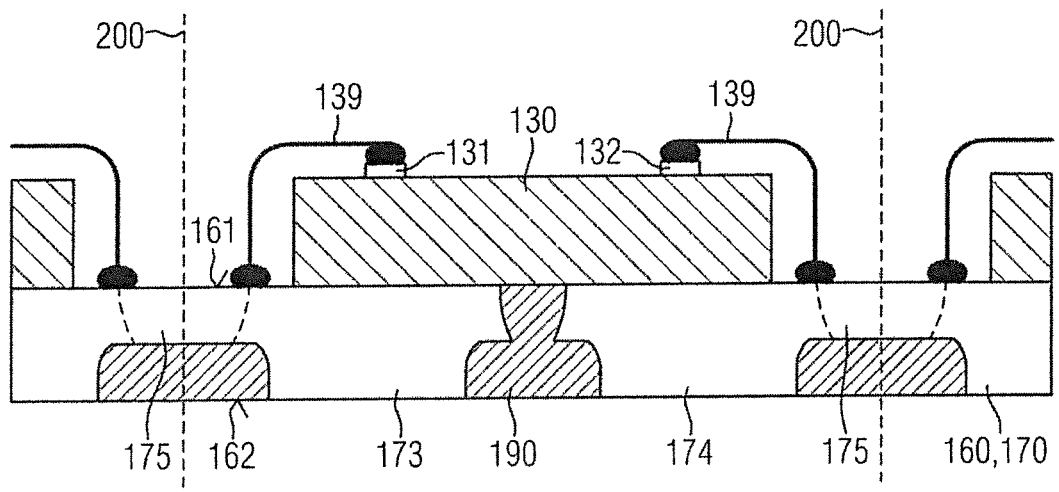

After mounting the optoelectronic semiconductor chips 130, as shown in FIG. 18, forming or arranging bond wires 139 for the electrical wiring of the semiconductor chips 130 is carried out. Two bond wires 139 are used in each semiconductor chip 130 such that the front-side contact 131 connects to the carrier element 173 and the front-side contact 132 connects to the carrier element 174. The bond wires 139 connect to the carrier elements 173, 174 in each case laterally with respect to the semiconductor chips 130.

Figure 19:
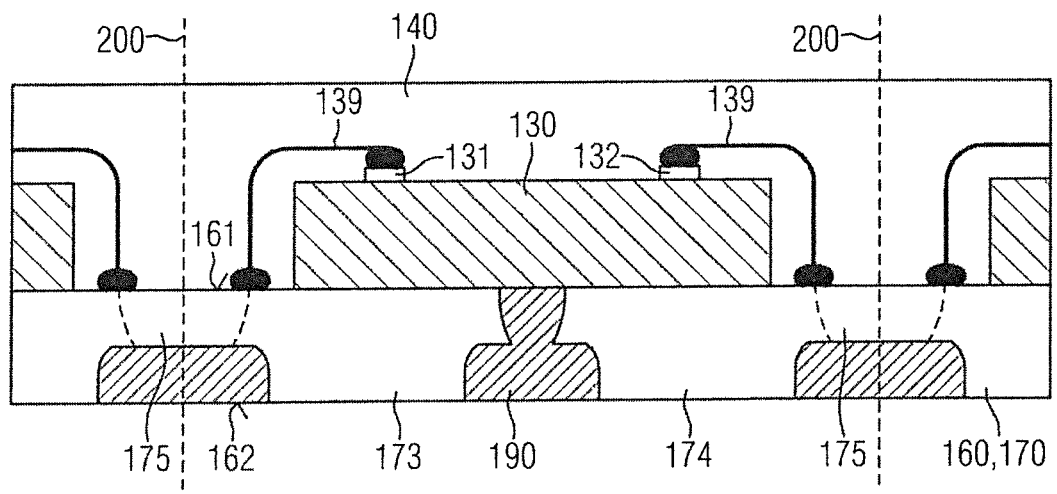

Afterward, as shown in FIG. 19, a continuous conversion layer 140 that is planar at a front side is formed on the front side 161 of the carrier 160, and encloses the semiconductor chips 130 and bond wires 139. Since the carrier 160 comprises a continuous or closed form, no rear-side contamination of the carrier 160 with material of the conversion layer 140 occurs.

Features and properties the same as those explained above with regard to the method in FIGS. 1 to 7 may apply to the encapsulating conversion layer 140 used for radiation or volume conversion. The conversion layer 140 comprises a radiation-transmissive basic material such as silicone, for example, phosphor particles bringing about the radiation conversion and filler particles (not illustrated).

By virtue of the filler, the conversion layer 140 may have an increased thermal conductivity, as a result of which a reliable cooling of the phosphor particles and an efficient mode of operation of the components 151 are possible. Further possible advantages are a small coefficient of thermal expansion of the converter layer 140 and a high robustness and rigidity, as a result of which the risk of component damage may be low.

These advantages may be distinctly pronounced if the conversion layer 140 is highly filled, i.e., comprises a high proportion of filler and filler particles having mixed granulation are present. In this case, the filler particles may comprise, for example, a proportion by weight of more than 60% of the conversion layer 140. Forming such a conversion layer 140 may be carried out with the aid of a compression molding process. A suitable tool is used in this case. Alternatively, a cost-effective potting process may be carried out. In this case, a frame is formed on the carrier 160 beforehand. During potting, a region enclosed by the frame is filled, for example, by the use of a needle metering unit. In the potting process, however, only materials comprising a small proportion by weight of filler, for example, of less than 60%, may be used. For further details, reference is made to the above description.

Figure 20:
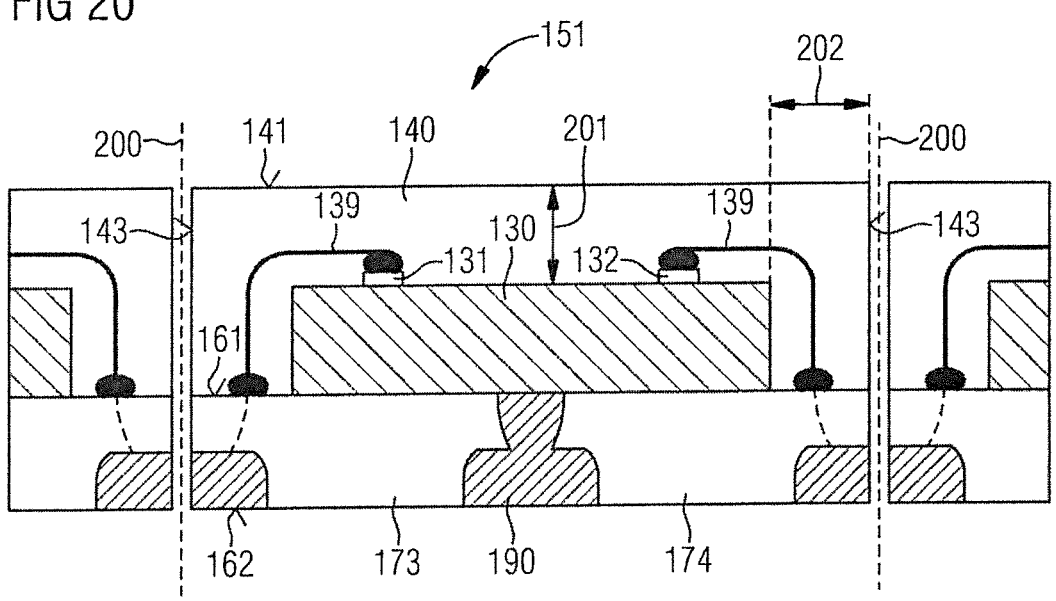

The component assemblage present after forming or curing the conversion layer 140 is subsequently severed at the separating lines 200, as shown in FIG. 20. Singulated optoelectronic components 151 are constituted in this way. Severing of the conversion layer 140, of the connection elements 175 of the leadframe 170 and of the molding compound 190 are carried out during singulation.

Severing may be carried out in various ways. By way of example, sawing or separating by grinding, water jet separation or laser separation are possible. Moreover, it is also possible to use a two-stage process in which, for example, cutting (using razor blades, not suitable for severing material of the leadframe 170) is combined with a different process such as sawing, for example.

The singulated optoelectronic components 151 are compactly constructed single-chip components comprising in each case two carrier elements 173, 174, one semiconductor chip 130 located on the two carrier elements 173, 174, two bond wires 139 and a conversion layer section 140 enclosing the chip 130 and the bond wires 139. The carrier elements 173, 174 exposed on the rear side serve as connection pads (bond pads) such that the components 151 may be arranged on a circuit board (not shown) by reflow soldering.

Via the carrier elements 173, 174 and the bond wires 139, electrical energy to generate radiation may be fed to the semiconductor chips 130 of the components 151. The radiation generated by the semiconductor chips 130 may be at least partly converted with the aid of the associated conversion layer sections 140. By way of example, provision may be made for the semiconductor chips 130 to be configured to generate a blue or ultraviolet light radiation, and for the components 151 to emit white light radiation on account of the radiation conversion.

In each optoelectronic component 151, the conversion layer section 140 via which the radiation of the component 151 may be emitted constitutes a significant part of the outer surfaces of the component 101. The latter include a front side 141 and a significant part of a circumferential lateral surface 143 of the component 151. As shown in FIG. 21, the components 151 are formed with a contour that is rectangular in plan view. In this case, the lateral surface 143 may comprise four side walls adjoining one another at right angles.

In the components 151, too, the conversion layer section 140 is arranged around the associated semiconductor chip 130 such that the thickness of the conversion layer section 140 at each chip side, that is to say at the front side and at the circumference of the chip 130, corresponds or is of approximately the same magnitude. In this respect, FIG. 20 indicates the material thickness at the front side with the aid of a double-headed arrow 201, and the material thickness at the circumference of the chip 130 with the aid of a double-headed arrow 202. The corresponding material thicknesses 201, 202 make it possible to achieve a high color homogeneity across different emission angles during the operation of the components 151.

The material thicknesses 201, 202 may be 250 µm, for example. However, thicknesses of 100 to 500 µm are also possible. The choice of a layer thickness may depend on different boundary conditions. A thinner layer thickness may be associated with a less efficient radiation conversion. Moreover, it may be more difficult to set a uniform layer thickness of the conversion layer 140. A larger thickness may lead to a poorer cooling of the phosphor particles.

The optoelectronic components 151 may have a lateral component size of 1 mm×1.5 mm, for example, given a lateral chip size of 500 µm×1000 µm and a circumferential layer thickness of the conversion layer 140 of 250 µm.

Possible variants and modifications of the method explained with reference to FIGS. 15 to 21 are described below. Corresponding features and aspects and identical and identically acting component parts will not be described in detail again hereinafter. Instead, for details in this respect, reference is made to the above description. Furthermore, it is possible to combine features of two or more of the examples described below.

Figure 22:
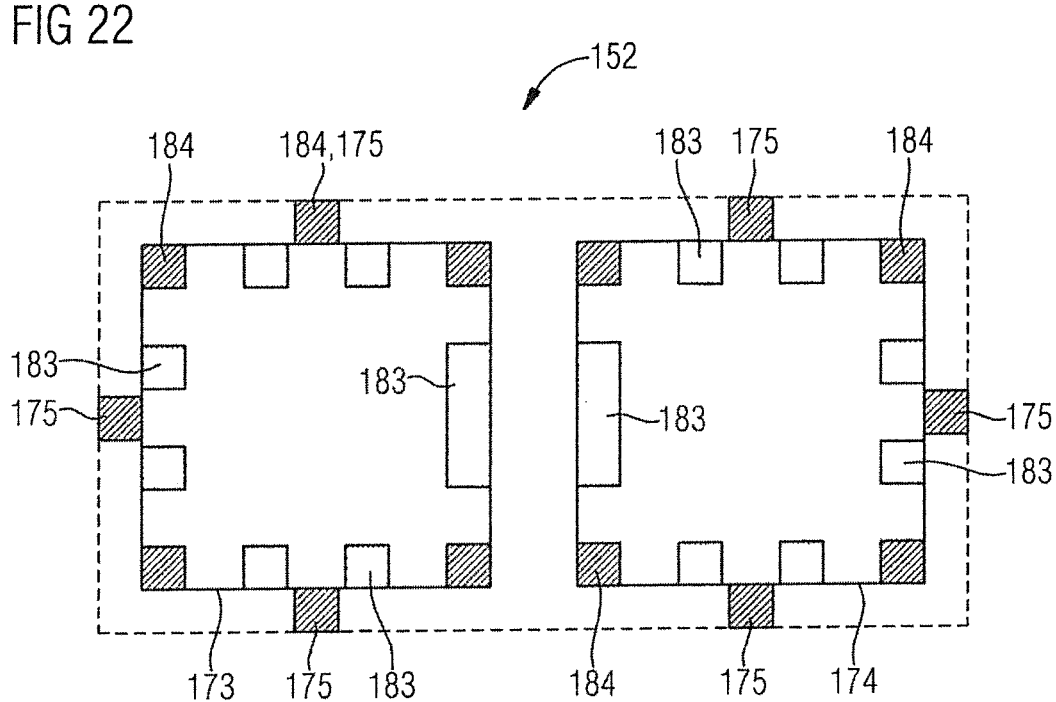
FIG. 22 shows a plan view illustration of carrier elements of a further component, wherein front-side and rear-side etching regions are additionally indicated at the edge of the carrier elements.

In one possible method example, the above-described front- and rear-side etching of the metallic initial layer to provide the leadframe 170 is carried out such that in each case in the area of a circumferential edge of the carrier elements 173, 174 etching is carried out alternately in front-side etching regions 183 and rear-side etching regions 184. To illustrate this aspect, FIG. 22 shows a schematic plan view illustration of the two carrier elements 173, 174 of an optoelectronic component 152 formed in this way. The connection structures 175 are formed by rear-side etching, as in the case of the configuration described previously such that rear-side etching regions 184 are present at these locations. Furthermore, at the edge of the carrier elements 173, 174, further rear-side etching regions 184 are provided, and front-side etching regions 183 are additionally provided as well. The different half-etchings or etching regions 183, 184 are present alternately circumferentially at the edge of the carrier elements 173, 174.

Figure 23:
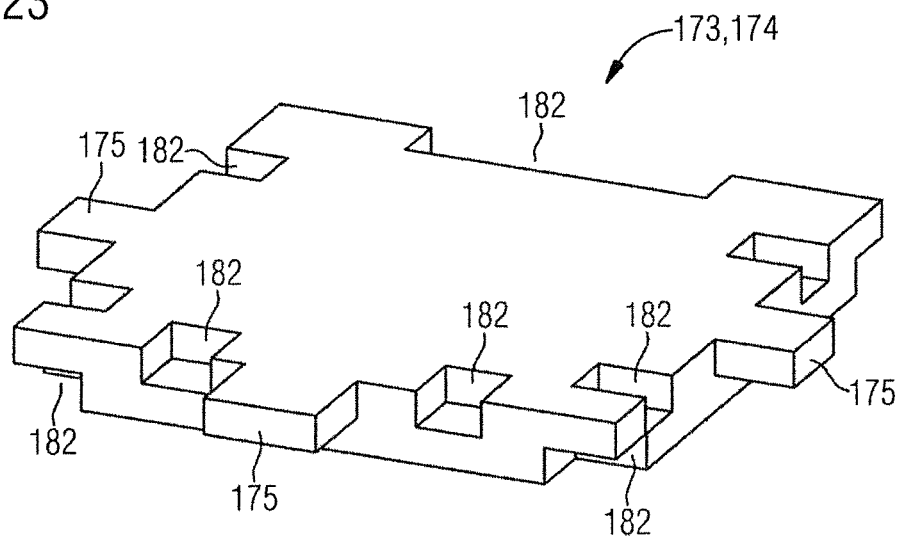
FIGS. 23 and 24 show perspective illustrations of a carrier element from FIG. 22.
Figure 24:
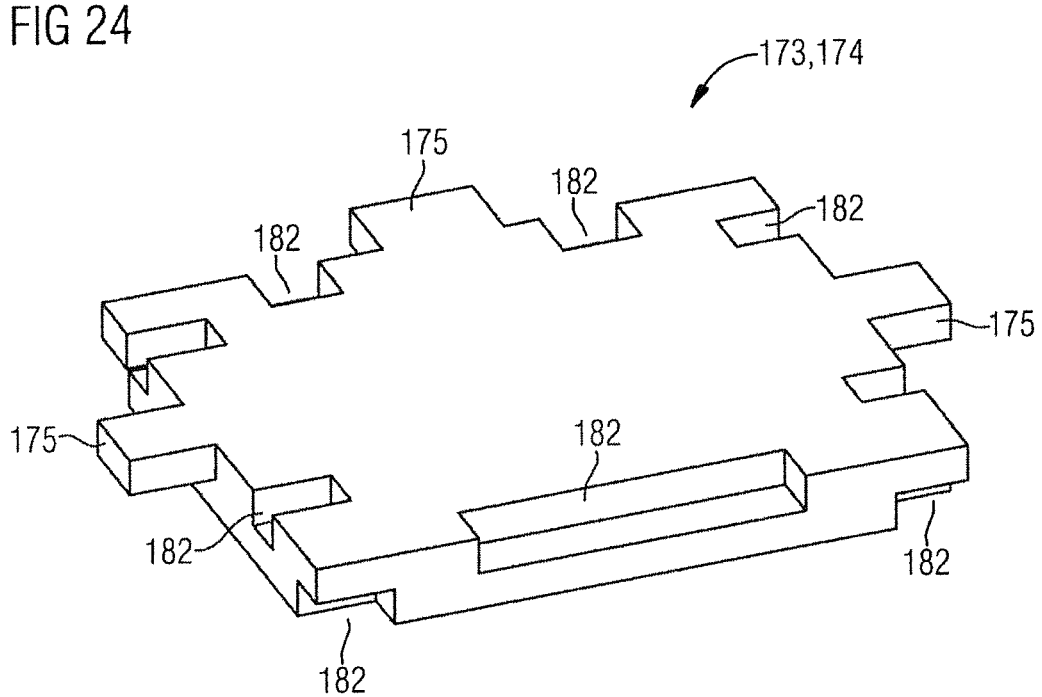

For better illustration, FIGS. 23, 24 show different perspective illustrations of one of the carrier elements 173, 174. On account of the etching regions 183, 184, the carrier elements 173, 174 comprise corresponding marginal recesses 182. This configuration makes it possible to achieve an improved toothing and hence reliable anchoring of the molding compound 190 on the leadframe 170 or on the carrier elements 173, 174 thereof.

A further possible modification consists of forming multi-chip components comprising a plurality of semiconductor chips 130 (not illustrated) instead of single-chip components. The semiconductor chips 130 may electrically connect in series or in parallel, for example. For such components, the method is carried out with a correspondingly adapted configuration of the leadframe 170, arrangement of semiconductor chips 130, conducting or wiring and singulation. It is also possible to fabricate components whose semiconductor chips 130 are not electrically connected to one another. In the same way, an integration of other electronic component parts such as, for example, ESD protection diodes may be realized (not illustrated). Configurations of components in which a semiconductor chip 130 is arranged only on one carrier element of a leadframe 170 are furthermore possible (not illustrated). With regard to such configurations, for example, it is possible to realize components with plan view illustrations comparable to FIGS. 11 to 13, wherein in addition severed connection elements 175 are present at the edge of the carrier elements.

Furthermore, instead of the semiconductor chips 130, it is also possible to use other semiconductor chips such as, for example, flip-chips comprising two rear-side contacts (not illustrated). With the use of such semiconductor chips, the rear-side contacts may connect to the leadframe 170 or the carrier elements 173, 174, in each case via an electrically conductive connection layer. In this way, it is possible to realize, for example, components having a construction comparable with FIG. 21 (without bond wires 39 in the case of the associated flip-chip). Furthermore, it is possible to use surface emitters or thin-film emitter chips comprising a front-side contact and a rear-side contact. As a result, it is possible to realize, for example, components having a construction comparable to FIG. 14, in addition with severed connection elements 175 at the edge of the carrier elements.

The examples explained with reference to the figures constitute preferred or exemplary construction of our components. Besides the examples described and depicted, further examples are possible which may comprise further modifications and/or combinations of features. It is possible, for example, to use other materials instead of the materials indicated above. Moreover, other processes may be carried out instead of processes indicated above. Furthermore, light radiations having other colors or spectral ranges may be taken into consideration instead of the abovementioned colors of light radiations for the semiconductor chips and/or components.

Although our components and methods have been more specifically illustrated and described in detail by preferred examples, nevertheless this disclosure is not restricted by the examples disclosed and other variations may be derived therefrom by those skilled in the art, without departing from the scope of protection of the appended claims.

This application claims priority of DE 10 2014 102 810.4, the subject matter of which is hereby incorporated by reference.

The invention claimed is:

1. A method of producing optoelectronic components, comprising:
   providing a carrier;
   arranging optoelectronic semiconductor chips on the carrier;

forming a conversion layer for radiation conversion on the carrier, wherein the optoelectronic semiconductor chips are surrounded by the conversion layer; and carrying out a singulation process to form separate optoelectronic components, wherein at least the conversion layer is severed, wherein the carrier is a metallic carrier comprising recesses extending through the carrier from a front side to a rear side of the carrier, during forming the conversion layer on the carrier, the conversion layer is arranged in the recesses; and the carrier is structured into separate carrier elements after forming the conversion layer and before carrying out the singulation process.

2. The method according to claim 1, wherein structuring the carrier comprises carrying out an etching process.

3. The method according to claim 1, wherein, after structuring the carrier, a reflective compound is arranged in intermediate regions between the carrier elements.

4. The method according to claim 1, wherein forming the conversion layer comprises carrying out a potting process or a molding process.

5. The method according to claim 1, wherein the optoelectronic semiconductor chips are volume emitters.

6. The method according to claim 1, wherein each of the separate optoelectronic components comprises a section of the conversion layer that constitutes a front side and a part of a circumferential lateral surface of the optoelectronic component.

7. The method according to claim 1, wherein each of the separate optoelectronic components comprises a section of the conversion layer and an optoelectronic semiconductor chip, wherein the optoelectronic semiconductor chip is surrounded by the conversion layer section such that a corresponding material thickness of the conversion layer section is present at a front side and at a circumference of the optoelectronic semiconductor chip.

8. The method according to claim 1, wherein the recesses of the carrier comprise a shape widening in a stepped manner.

9. The method according to claim 1, wherein the recesses of the carrier comprise a shape widening in a stepped manner in a direction of the rear side of the carrier, and the recesses comprise two partial regions having different lateral dimensions.

10. The method according to claim 1, wherein the structuring of the carrier into the separate carrier elements is carried out such that the recesses or partial regions of the recesses are arranged at the edge of the separate carrier elements.

11. The method according to claim 1, wherein the conversion layer is at least one of a layer comprising a radiation-transmissive basic material, phosphor particles and a filler, or a layer adjoining a front side and a circumference of the optoelectronic semiconductor chips.

* * * * *